US012565038B2

(12) United States Patent
Ide et al.

(10) Patent No.: US 12,565,038 B2
(45) Date of Patent: Mar. 3, 2026

(54) DRIVE CIRCUIT AND LIQUID EJECTING APPARATUS

(71) Applicant: SEIKO EPSON CORPORATION, Tokyo (JP)

(72) Inventors: Noritaka Ide, Shiojiri (JP); Kunio Tabata, Shiojiri (JP); Dai Nozawa, Matsumoto (JP); Rika Tanimoto, Matsumoto (JP); Satoru Uematsu, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 239 days.

(21) Appl. No.: 18/599,721

(22) Filed: Mar. 8, 2024

(65) Prior Publication Data

US 2024/0300239 A1 Sep. 12, 2024

(30) Foreign Application Priority Data

Mar. 9, 2023 (JP) ................................. 2023-036616

(51) Int. Cl.
  *B41J 2/045* (2006.01)
  *H03K 17/687* (2006.01)
(52) U.S. Cl.
  CPC ......... *B41J 2/04541* (2013.01); *B41J 2/0459* (2013.01); *H03K 17/6871* (2013.01); *B41J 2/04581* (2013.01)
(58) Field of Classification Search
  CPC .................................................. B41J 2/04541
  See application file for complete search history.

(56) References Cited

U.S. PATENT DOCUMENTS

| | | | | |
|---|---|---|---|---|
| 2010/0127777 A1* | 5/2010 | Yoshino | ............... | B41J 2/04581 |
| | | | | 330/277 |
| 2010/0188452 A1* | 7/2010 | Oshima | ............... | B41J 2/04541 |
| | | | | 347/11 |
| 2022/0097364 A1 | 3/2022 | Ide et al. | | |
| 2022/0169012 A1* | 6/2022 | Ide | ........................ | B41J 2/0455 |
| 2022/0169014 A1* | 6/2022 | Tabata | ............... | H03K 17/6871 |
| 2023/0302787 A1* | 9/2023 | Ide | ........................ | B41J 2/04581 |
| 2023/0302791 A1* | 9/2023 | Ide | ........................ | B41J 2/04548 |

FOREIGN PATENT DOCUMENTS

JP        2022-057167 A        4/2022

* cited by examiner

*Primary Examiner* — Shelby L Fidler
(74) *Attorney, Agent, or Firm* — Harness, Dickey & Pierce, P.L.C.

(57) ABSTRACT

A drive circuit includes a modulation circuit that outputs a modulation signal, an amplification circuit that outputs a first amplified modulation signal obtained by amplifying the modulation signal, a reference signal generation circuit that generates a reference signal corresponding to the base drive signal, a level switching signal generation circuit that receives, as an input, the reference signal, and generates a level switching signal, a level shift circuit that outputs the first amplified modulation signal, or outputs a signal obtained by shifting a potential of the first amplified modulation signal, a demodulation circuit that demodulates the second amplified modulation signal, and outputs the drive signal, and a feedback circuit that outputs a first feedback signal in response to the drive signal. The level switching signal generation circuit switches a potential of the level switching signal in response to the reference signal and the first feedback signal.

14 Claims, 20 Drawing Sheets

DRIVE CIRCUIT AND LIQUID EJECTING APPARATUS

The present application is based on, and claims priority from JP Application Serial Number 2023-036616, filed Mar. 9, 2023, the disclosure of which is hereby incorporated by reference herein in its entirety.

BACKGROUND

1. Technical Field

The present disclosure relates to a drive circuit and a liquid ejecting apparatus.

2. Related Art

As a liquid ejecting apparatus that ejects a liquid to form an image or a document on a medium, a device using piezoelectric elements is known. In such a liquid ejecting apparatus, the piezoelectric elements are provided to correspond to a plurality of nozzles that eject the liquid, and is driven according to a drive signal. The piezoelectric element is driven, and the liquid is ejected from the nozzle provided to correspond to the piezoelectric element. It is necessary to supply a sufficient current in order to operate such a piezoelectric element. Thus, a drive circuit that outputs a drive signal for driving the piezoelectric element includes an amplification circuit that amplifies a source signal that is a base of the drive signal by an amplification circuit.

JP-A-2022-057167 discloses a drive circuit that can efficiently amplify a signal by including a pulse modulation circuit that modulates a base drive signal that is a base of a drive signal and outputs a modulation signal, an amplification circuit that outputs an amplified modulation signal obtained by amplifying the modulation signal from a first output point, a level shift circuit that outputs a level shift amplified modulation signal obtained by shifting a potential of the amplified modulation signal from a second output point, and a demodulation circuit that demodulates the level shift amplified modulation signal, and outputs a drive signal.

However, from the viewpoint of a switching loss of a level shift circuit or waveform accuracy of a drive signal, a technology described in JP-A-2022-057167 is not sufficient, and there is room for improvement.

SUMMARY

According to an aspect of the present disclosure, there is provided a drive circuit that outputs a drive signal for driving a drive section. The drive circuit includes a modulation circuit that modulates a base drive signal that is a base of the drive signal, and outputs a modulation signal, an amplification circuit that outputs a first amplified modulation signal obtained by amplifying the modulation signal, a reference signal generation circuit that generates a reference signal corresponding to the base drive signal, a level switching signal generation circuit that receives, as an input, the reference signal, and generates a level switching signal as a digital signal including a first potential and a second potential higher than the first potential, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, a demodulation circuit that demodulates the second amplified modulation signal, and outputs the drive signal, and a feedback circuit that outputs a first feedback signal in response to the drive signal. The level switching signal generation circuit switches a potential of the level switching signal in response to the reference signal and the first feedback signal.

According to another aspect of the present disclosure, there is provided a liquid ejecting apparatus including an ejecting section that ejects a liquid, and a drive circuit that outputs a drive signal for driving the ejecting section. The drive circuit includes a modulation circuit that modulates a base drive signal that is a base of the drive signal, an amplification circuit that outputs a first amplified modulation signal obtained by amplifying the modulation signal, a reference signal generation circuit that generates a reference signal corresponding to the base drive signal, a level switching signal generation circuit that receives, as an input, the reference signal, and generates a level switching signal as a digital signal including a first potential and a second potential higher than the first potential, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, a demodulation circuit that demodulates the second amplified modulation signal, and outputs the drive signal, and a feedback circuit that outputs a first feedback signal in response to the drive signal, and the level switching signal generation circuit switches a potential of the level switching signal in response to the reference signal and the first feedback signal.

DESCRIPTION OF EMBODIMENTS

Hereinafter, appropriate embodiments of the present disclosure will be described with reference to the drawings. The drawings to be used are for the sake of convenience in description. In addition, embodiments to be described below do not inappropriately limit the contents of the present disclosure described in the claims. Moreover, not all of configurations to be described below are necessarily essential components of the present disclosure.

In the following description, an ink jet printer for a consumer is used as an example of a liquid ejecting apparatus according to the present disclosure. However, the liquid ejecting apparatus is not limited to an ink jet printer, and may be, for example, a coloring material ejecting apparatus used for manufacturing a color filter such as a liquid crystal display, an electrode material ejecting apparatus used for forming an electrode such as an organic EL display and a surface emission display, and a bioorganic substance ejecting apparatus used for manufacturing a biochip.

1. First Embodiment 1-1. Overview of Liquid Ejecting Apparatus

Figure 1:
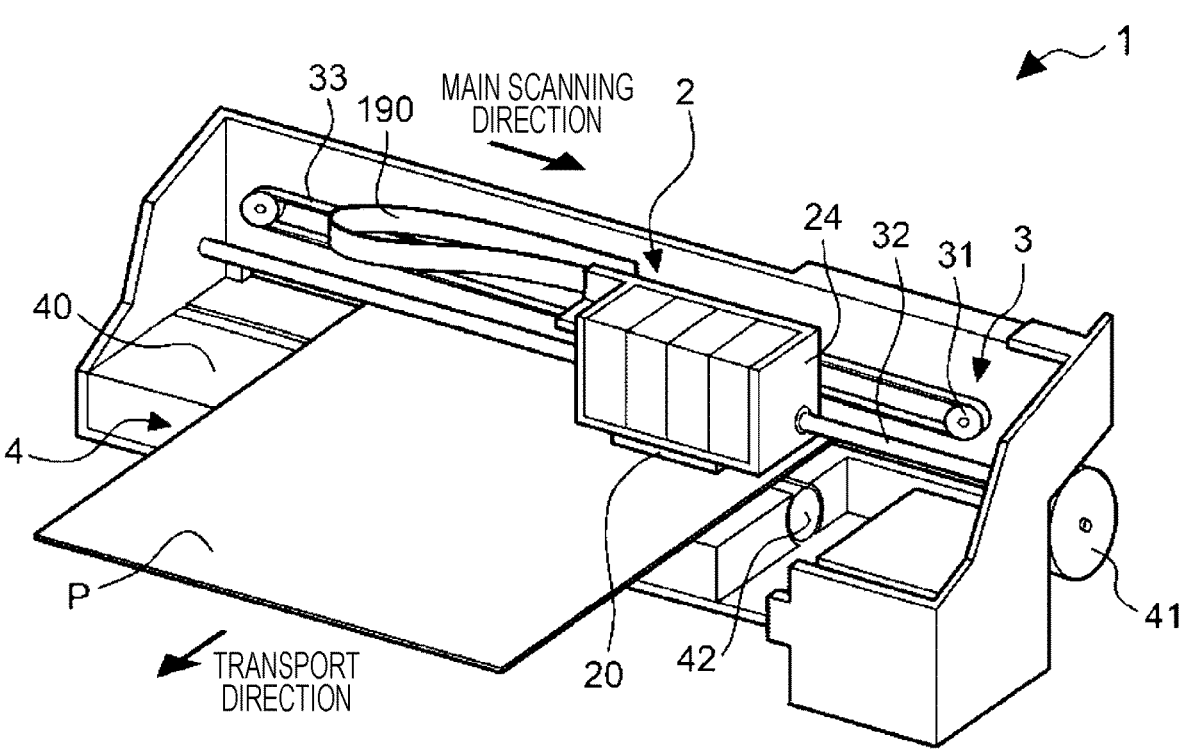
FIG. 1 is a diagram illustrating an example of a structure of a liquid ejecting apparatus.

FIG. 1 is a diagram illustrating an example of a structure of a liquid ejecting apparatus 1. As illustrated in FIG. 1, the liquid ejecting apparatus 1 includes a moving object 2 and a moving unit 3 that causes the moving object 2 to reciprocate along a main scanning direction.

The moving unit 3 includes a carriage motor 31 that is a drive source for the reciprocating of the moving object 2 along the main scanning direction, a carriage guide shaft 32 that has fixed both ends, and a timing belt 33 that extends substantially parallel to the carriage guide shaft 32 and is driven by the carriage motor 31.

The moving object 2 includes a carriage 24. The carriage 24 is supported by the carriage guide shaft 32 to be able to reciprocate and is fixed to a part of the timing belt 33. The timing belt 33 travels forward and rearward by the carriage motor 31, and thus, the moving object 2 having the carriage 24 is guided by the carriage guide shaft 32 to reciprocate. Moreover, a head unit 20 is positioned in a portion of the moving object 2 facing a medium P. That is, the head unit 20 is mounted on the carriage 24. Multiple nozzles that eject ink as a liquid are positioned on a surface of the head unit 20 facing the medium P. Moreover, various control signals for controlling an operation of the head unit 20 are supplied to the head unit 20 via a cable 190. A flexible flat cable or the like that can slide to follow the reciprocating of the moving object 2 can be used as such a cable 190.

Moreover, the liquid ejecting apparatus 1 includes a transport unit 4 for transporting the medium P on a platen 40 along a transport direction. The transport unit 4 includes a transport motor 41 that is a drive source for transporting the medium P, and a transport roller 42 that transports the medium P along the transport direction by being rotated with a drive force of the transport motor 41.

In the liquid ejecting apparatus 1 having the above-described configuration, the head unit 20 ejects the ink on the medium P in synchronization with a timing at which the medium P is transported by the transport unit 4. Consequently, the ink ejected by the head unit 20 lands at a desired position on the medium P, and a desired image or character is formed at the surface of the medium P.

Figure 2:
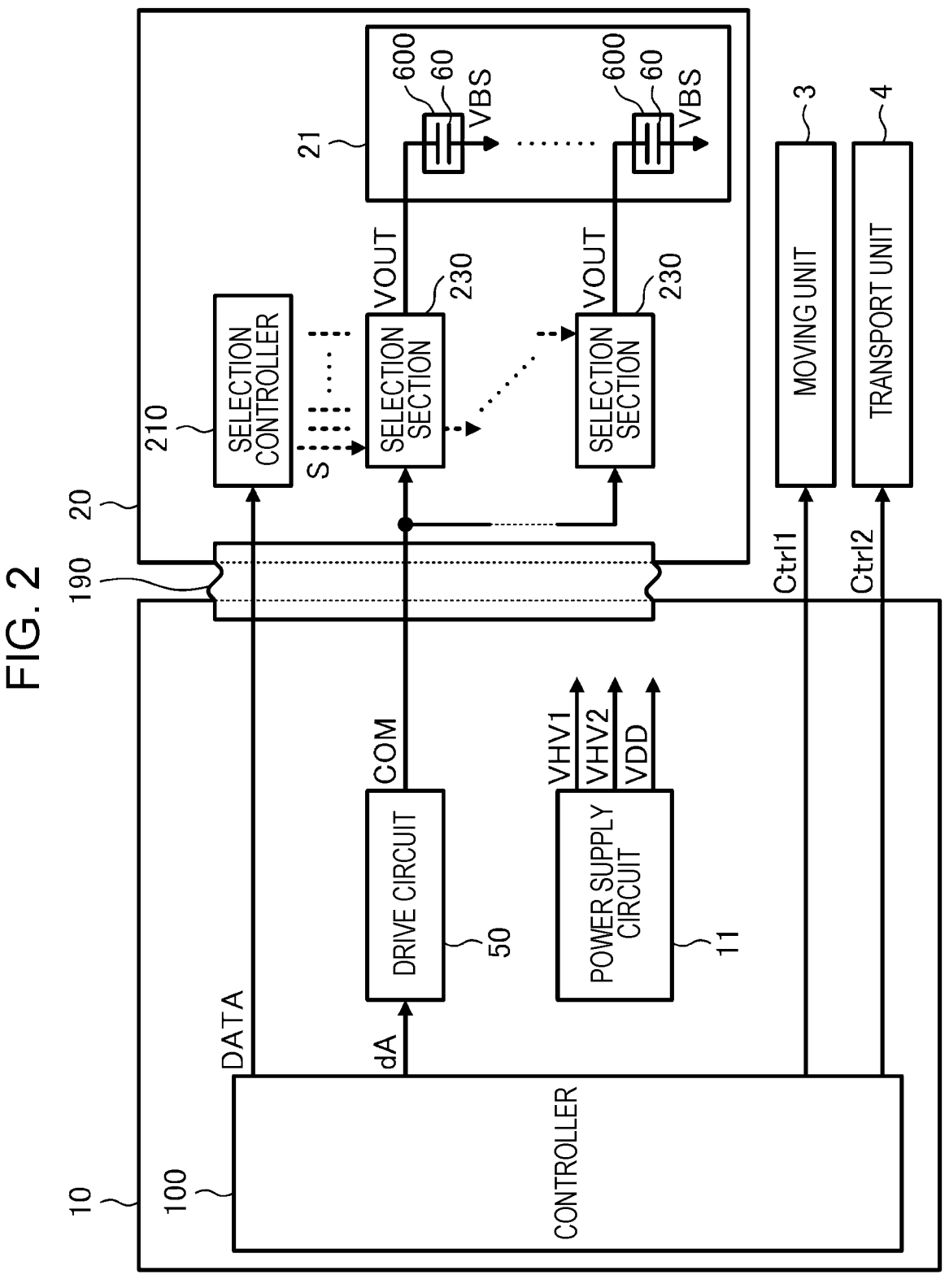
FIG. 2 is a diagram illustrating a functional configuration of the liquid ejecting apparatus.

Next, a functional configuration of the liquid ejecting apparatus 1 will be described. FIG. 2 is a diagram illustrating the functional configuration of the liquid ejecting apparatus 1. As illustrated in FIG. 2, the liquid ejecting apparatus 1 includes a control unit 10, the head unit 20, the moving unit 3, the transport unit 4, and the cable 190. The cable 190 electrically couples the control unit 10 and the head unit 20.

The control unit 10 includes a power supply circuit 11, a controller 100, and a drive circuit 50.

The power supply circuit 11 generates voltage signals VHV1, VHV2, and VDD having predetermined voltage values from a commercial AC power supply supplied from an outside of the liquid ejecting apparatus 1, and outputs the voltage signals to the sections of the liquid ejecting apparatus 1. Here, the voltage signals VHV1 and VHV2 output by the power supply circuit 11 are, for example, a DC voltage of 21 V, and the voltage signal VDD is, for example, a DC voltage of 3.3 V. Such a power supply circuit 11 may include, for example, an AC/DC converter that generates a DC voltage having a predetermined voltage value from a commercial AC power supply, and a DC/DC converter that converts the voltage value of the generated DC voltage to generate the voltage signals VHV1, VHV2, and VDD. In addition, the power supply circuit 11 may output DC voltages having different voltage values in addition to the voltage signals VHV1, VHV2, and VDD. Here, in the following description, the voltage of the voltage signal VHV1 may be referred to as a voltage vhv1, the voltage of the voltage signal VHV2 may be referred to as a voltage vhv2, and the voltage of the voltage signal VDD may be referred to as a voltage vdd.

Image data is supplied to the controller 100 from an external device (not illustrated) provided outside the liquid ejecting apparatus 1, for example, from a host computer or the like. The controller 100 generates various control signals for controlling the sections of the liquid ejecting apparatus 1 by performing various kinds of image processing and the like on the supplied image data, and outputs the various control signals to the corresponding sections.

Specifically, the controller 100 generates a control signal Ctrl1 for controlling the reciprocating of the moving object 2 based on the image data, and outputs the control signal Ctrl1 to the carriage motor 31 included in the moving unit 3. Moreover, the controller 100 generates a control signal Ctrl2 for controlling the transport of the medium P based on the image data, and outputs the control signal Ctrl2 to the transport motor 41 included in the transport unit 4. Consequently, the reciprocating of the moving object 2 along the main scanning direction and the transport of the medium P along the transport direction are controlled by the controller 100. That is, the head unit 20 can eject the ink on the medium P at a predetermined timing synchronized with the transport of the medium P.

Consequently, the ink can be landed at a desired position on the medium P, and a desired image or character can be formed at the medium P.

In addition, the controller 100 may convert the control signal Ctrl1 for controlling the reciprocating of the moving object 2 by a carriage motor driver (not illustrated) and then supply the converted control signal to the moving unit 3. Similarly, the controller 100 may convert the control signal Ctrl2 for controlling the transport of the medium P by a transport motor driver (not illustrated) and then supply the converted control signal to the transport unit 4.

Moreover, the controller 100 outputs a base drive signal dA to the drive circuit 50. Here, the base drive signal dA is a digital signal including information that defines a signal waveform of a drive signal COM supplied to the head unit 20. The drive circuit 50 converts the base drive signal dA into an analog signal, and then amplifies the converted signal to generate the drive signal COM. The drive circuit 50 supplies the generated drive signal COM to the head unit 20. In addition, a configuration and an operation of the drive circuit 50 will be described below in detail.

Moreover, the controller 100 generates a drive data signal DATA for controlling the operation of the head unit 20, and outputs the drive data signal DATA to the head unit 20. The head unit 20 includes a selection controller 210, a plurality of selection sections 230, and a liquid ejecting head 21. Moreover, the liquid ejecting head 21 includes a plurality of ejecting sections 600 each including a piezoelectric element 60. Each of the plurality of selection sections 230 is provided to correspond to the piezoelectric element 60 included in each of a plurality of ejecting sections 600 included in the liquid ejecting head 21.

The drive data signal DATA is input to the selection controller 210. The selection controller 210 generates a selection signal S instructing each of the selection sections 230 whether to select or not select the drive signal COM based on the drive data signal DATA, and outputs the selection signal S to each of the plurality of selection sections 230. The drive signal COM and the corresponding selection signal S are input to each of the plurality of selection sections 230. Each of the plurality of selection sections 230 selects or does not select the drive signal COM based on the selection signal S to generate and output a drive signal VOUT. That is, each of the plurality of selection sections 230 generates the drive signal VOUT based on the drive signal COM, and supplies the drive signal VOUT to one end of the piezoelectric element 60 included in the corresponding ejecting section 600 included in the liquid ejecting head 21.

Moreover, a reference voltage signal VBS is commonly supplied to the other end of the piezoelectric element 60 included in the plurality of ejecting sections 600. The reference voltage signal VBS is a signal that functions as a reference potential for driving the piezoelectric element 60 driven by the drive signal VOUT, and is, for example, a signal having a constant potential such as 5.5 V, 6 V, or a ground potential (0 V).

The piezoelectric element 60 is provided to correspond to each of the plurality of nozzles in the head unit 20. The piezoelectric element 60 is driven in accordance with a potential difference between the drive signal VOUT supplied to one end and the reference voltage signal VBS supplied to the other end. As a result, an amount of ink corresponding to a driving amount of the piezoelectric element 60 is ejected from the ejecting section 600 including the piezoelectric element 60.

In addition, although FIG. 2 illustrates a case where the head unit 20 has one liquid ejecting head 21, the number of liquid ejecting heads 21 included in the head unit 20 is not limited to one, and the head unit 20 may have a plurality of liquid ejecting heads 21 in accordance with the type and number of inks to be ejected.

As described above, the liquid ejecting apparatus 1 according to the present embodiment includes the plurality of piezoelectric elements 60 that are driven by the drive signals COM and VOUT being supplied, the liquid ejecting head 21 that ejects the ink as an example of the liquid by the driving of the plurality of piezoelectric elements 60, and the drive circuit 50 that outputs the drive signal COM.

1-2. Configuration of Ejecting Section

Figure 3:
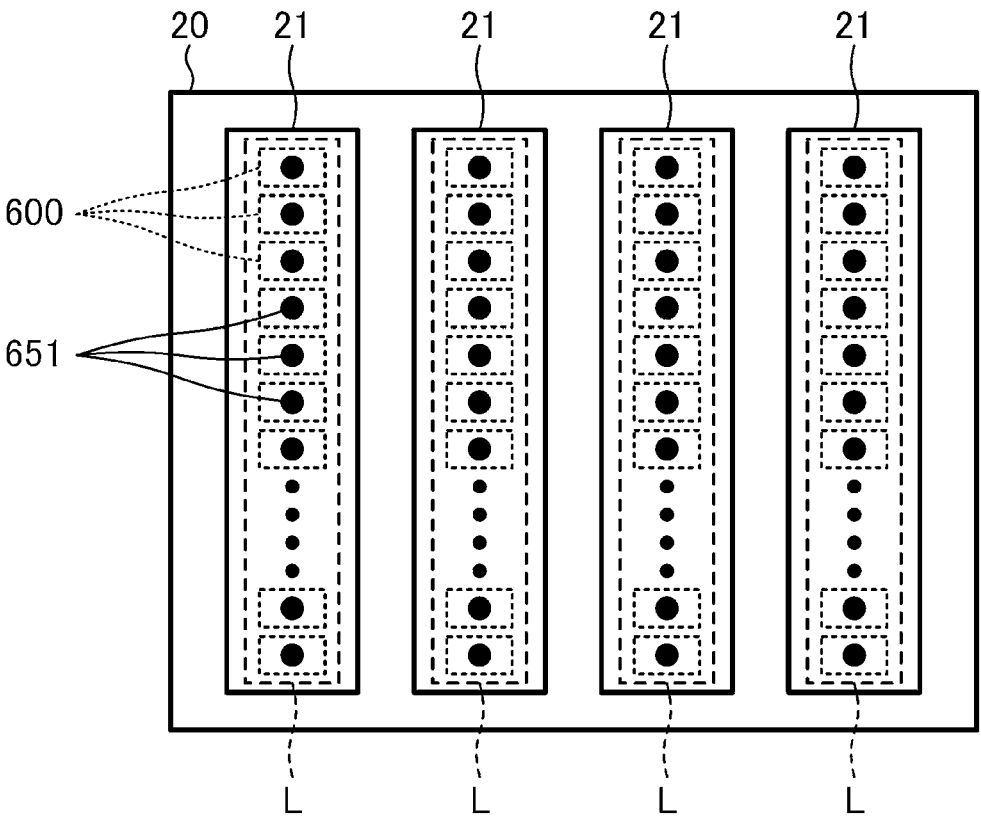
FIG. 3 is a diagram illustrating an example of disposition of a plurality of ejecting sections in a head unit.

Next, a configuration of the plurality of ejecting sections 600 included in the liquid ejecting head 21 and an example of the disposition of the plurality of ejecting sections 600 in the head unit 20 will be described. FIG. 3 is a diagram illustrating an example of the disposition of the plurality of ejecting sections 600 in the head unit 20. FIG. 3 illustrates a case where the head unit 20 includes four liquid ejecting heads 21.

As illustrated in FIG. 3, each of the four liquid ejecting heads 21 includes the plurality of ejecting sections 600 provided in a row in one direction. That is, the liquid ejecting head 21 includes a nozzle row L in which nozzles 651, to be described later, included in the ejecting section 600 are arranged in one direction. Moreover, the liquid ejecting heads 21 are positioned side by side in the head unit 20 in a direction intersecting the nozzle row L. That is, the head unit 20 is formed with the same number of nozzle rows L as the number of liquid ejecting heads 21. In addition, the disposition of the nozzles 651 in the nozzle row L is not limited to one row, and for example, even-numbered nozzles 651 counted from one end portion of the plurality of nozzles 651 and odd-numbered nozzles 651 counted from one end portion of the plurality of nozzles 651 may be disposed in a staggered manner such that positions of the even-numbered nozzles 651 and the odd-numbered nozzles 651 are different, and one nozzle row L may be formed by providing the plurality of nozzles 651 side by side in two or more rows.

Figure 4:
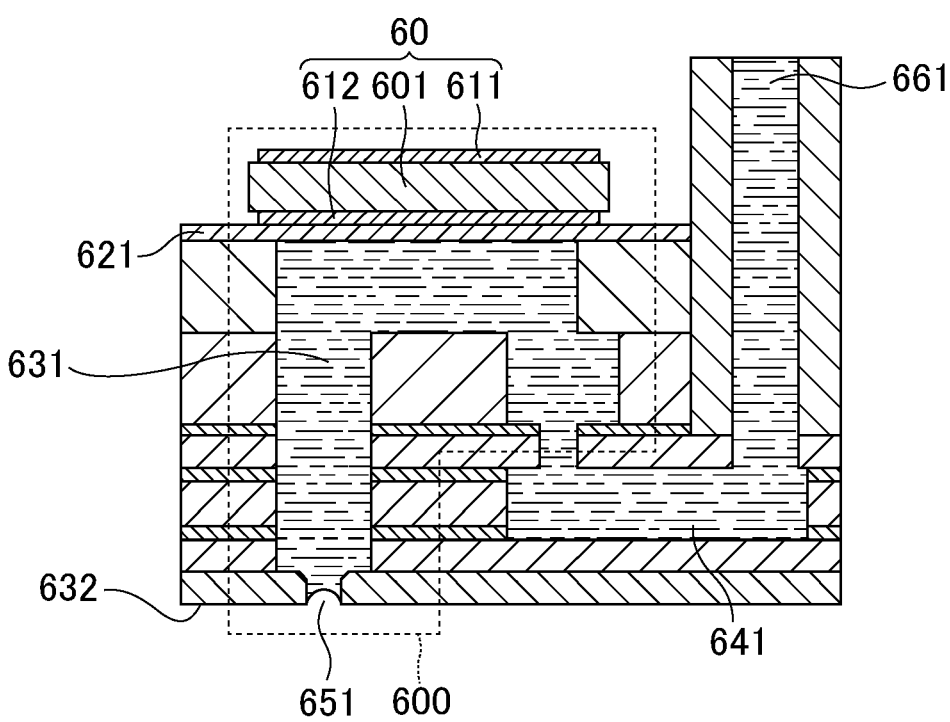
FIG. 4 is a diagram illustrating an example of a configuration of the ejecting section.

Next, an example of a configuration of the ejecting section 600 will be described. FIG. 4 is a diagram illustrating an example of the configuration of the ejecting section 600. As illustrated in FIG. 4, the ejecting section 600 includes the piezoelectric element 60, a vibrating plate 621, a cavity 631, and the nozzle 651. The vibrating plate 621 is displaced as the piezoelectric element 60 provided on an upper surface in FIG. 4 is driven. The vibrating plate 621 functions as a diaphragm that expands/contracts an internal volume of the cavity 631. The inside of the cavity 631 is filled with ink. The cavity 631 functions as a pressure chamber in which an internal volume changes due to the displacement of the vibrating plate 621 caused by the driving of the piezoelectric element 60. The nozzle 651 is an opening portion formed in the nozzle plate 632 and communicating with the cavity 631. As the internal volume of the cavity 631 changes, the ink stored inside the cavity 631 is ejected from the nozzle 651.

The piezoelectric element 60 has a structure in which a piezoelectric body 601 is interposed between a pair of electrodes 611 and 612. In the piezoelectric body 601 having this structure, central portions of the electrodes 611 and 612 and the vibrating plate 621 are bent in an up-down direction in FIG. 4 with respect to both end portions in accordance with a potential difference between the electrodes 611 and 612.

Specifically, the drive signal VOUT is supplied to the electrode 611 which is one end of the piezoelectric element 60, and the reference voltage signal VBS is supplied to the electrode 612 which is the other end. When the piezoelectric element 60 is driven in an up direction in accordance with a change in the voltage of the drive signal VOUT, the vibrating plate 621 is displaced in the up direction. As a result, the internal volume of the cavity 631 is expanded. Accordingly, the ink stored in a reservoir 641 is drawn into the cavity 631. On the other hand, when the piezoelectric element 60 is driven in a down direction in accordance with a change in the voltage of the drive signal VOUT, the vibrating plate 621 is displaced in a down direction. As a result, the internal volume of the cavity 631 is contracted. Accordingly, an amount of ink corresponding to a degree of contraction in the internal volume of the cavity 631 is ejected from the nozzle 651.

As described above, the liquid ejecting head 21 includes the piezoelectric element 60, and ejects the ink on the medium P by driving the piezoelectric element 60. In addition, the ejecting section 600 and the piezoelectric element 60 included in the ejecting section 600 are not limited to the illustrated configuration, and may have a structure in which the piezoelectric element 60 is driven based on the drive signal VOUT and the ink can be ejected from the corresponding nozzle 651 by the driving of the piezoelectric element 60.

1-3. Configuration and Operation of Drive Circuit

Next, a configuration and an operation of the drive circuit 50 will be described.

1-3-1. Signal Waveform of Drive Signal COM

Figure 5:
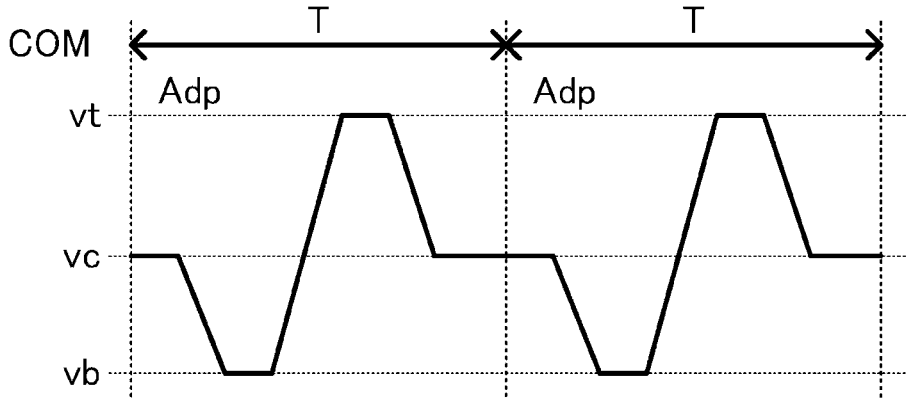
FIG. 5 is a diagram illustrating an example of a signal waveform of a drive signal.

In describing the configuration and the operation of the drive circuit 50, first, an example of the signal waveform of the drive signal COM output by the drive circuit 50 will be described. FIG. 5 is a diagram illustrating an example of the signal waveform of the drive signal COM. As illustrated in FIG. 5, the drive signal COM includes a trapezoidal waveform Adp for each cycle T. The trapezoidal waveform Adp includes a certain period at a voltage vc, a subsequent certain period at a voltage vb lower than the voltage vc after the certain period at the voltage vc, a subsequent certain period at a voltage vt is higher than the voltage vc after the certain period at the voltage vb, and a subsequent certain period at a voltage vc after the certain period at the voltage vt. That is, the drive signal COM includes the trapezoidal waveform Adp in which the voltage changes between the voltage vt and the voltage vb and starts at the voltage vc and ends at the voltage vc in the cycle T.

The voltage vc corresponds to a potential that is a reference for the displacement of the piezoelectric element 60. The voltage of the drive signal COM supplied to the piezoelectric element 60 changes from the voltage vc to the voltage vb, and thus, the piezoelectric element 60 is driven in the up direction as illustrated in FIG. 4. As a result, the vibrating plate 621 is displaced in the up direction as illustrated in FIG. 4. When the vibrating plate 621 is displaced in the up direction as illustrated in FIG. 4, the internal volume of the cavity 631 is expanded, and the ink is drawn from the reservoir 641 into the cavity 631. Thereafter, the voltage of the drive signal COM supplied to the piezoelectric element 60 changes from the voltage vb to the voltage vt, and thus, the piezoelectric element 60 is driven in the down direction as illustrated in FIG. 4. As a result, the vibrating plate 621 is displaced in the down direction as illustrated in FIG. 4. When the vibrating plate 621 is displaced in the down direction as illustrated in FIG. 4, the internal volume of the cavity 631 is contracted, and the ink stored in the cavity 631 is ejected from the nozzle 651.

Moreover, for a certain period after the ink is ejected from the nozzle 651 by driving the piezoelectric element 60, the ink in the vicinity of the nozzle 651 or the vibrating plate 621 may continue to vibrate. The certain period at the voltage vc included in the drive signal COM also functions as a period for stopping such vibration not contributing to the ejection of the ink caused in the ink or the vibrating plate 621.

Here, the signal waveform of the drive signal COM illustrated in FIG. 5 is an example, is not limited thereto, and may include various shapes of signal waveforms corresponding to physical properties of the ink ejected by the liquid ejecting head 21, a length of the cycle T of the drive signal COM, a transport speed of the medium P, and the like.

1-3-2. Configuration of Drive Circuit

Figure 6:
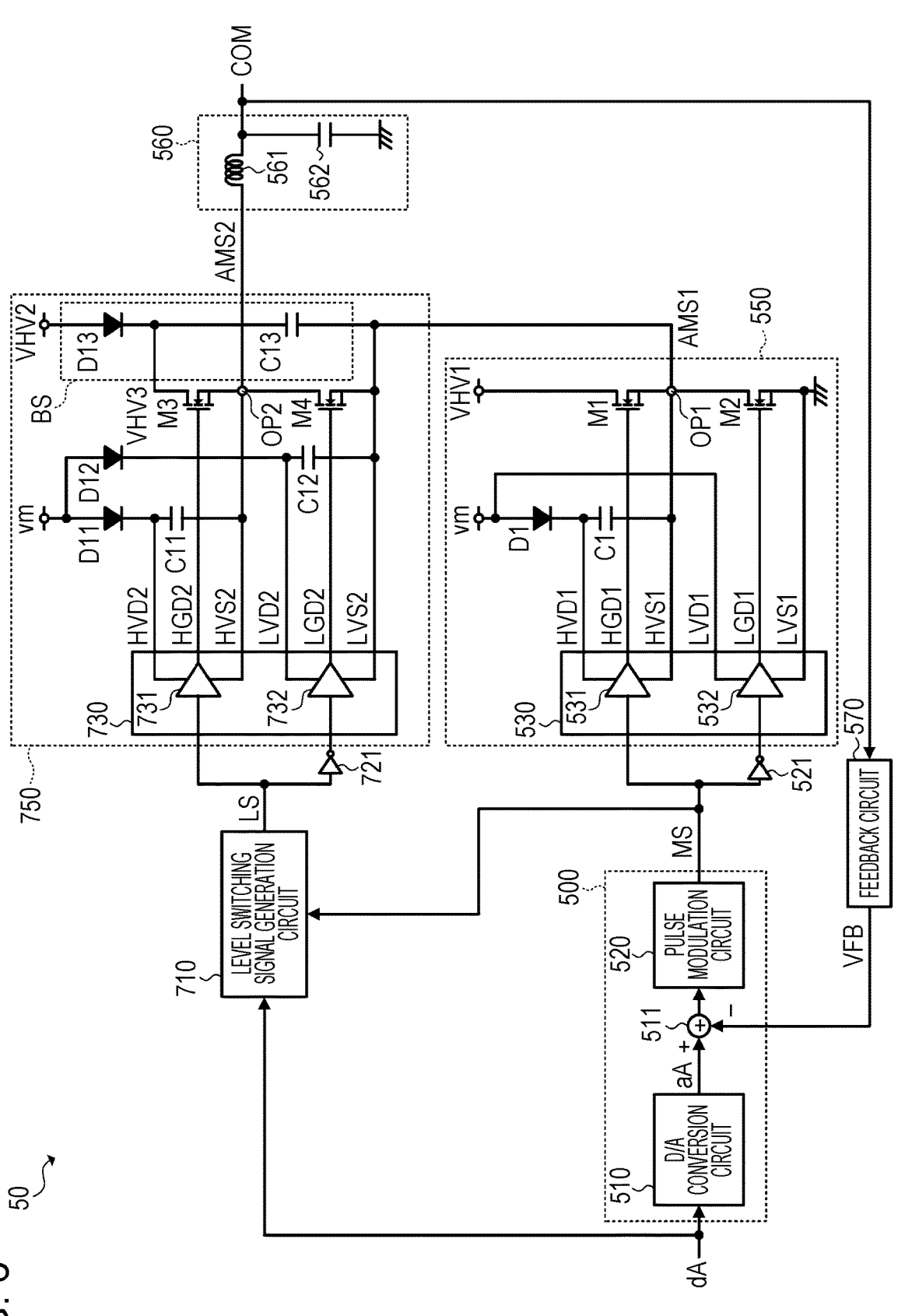
FIG. 6 is a diagram illustrating an example of a functional configuration of a drive circuit according to a first embodiment.

Next, the configuration of the drive circuit 50 will be described. FIG. 6 is a diagram illustrating an example of a functional configuration of the drive circuit 50 according to a first embodiment. As illustrated in FIG. 6, the drive circuit 50 includes a D/A conversion circuit 510, an adder 511, a pulse modulation circuit 520, an inverter 521, an amplification circuit 550, a demodulation circuit 560, a feedback circuit 570, a level switching signal generation circuit 710, and a level shift circuit 750.

The base drive signal dA as the digital signal is input from the controller 100 to the D/A conversion circuit 510. The D/A conversion circuit 510 performs digital-to-analog conversion of the base drive signal dA, and then outputs the converted analog signal as a base drive signal aA. A voltage amplitude of the base drive signal aA is, for example, 1 to 2 V, and the drive circuit 50 outputs, as the drive signal COM, a signal obtained by amplifying the base drive signal aA. That is, the base drive signal aA corresponds to a target signal before the amplification of the drive signal COM.

The base drive signal aA is input to an input terminal of the adder 511 on a + side. A feedback signal VFB obtained by feeding back the drive signal COM via the feedback circuit 570 to be described later is input to an input terminal of the adder 511 on a − side. The adder 511 outputs, to the pulse modulation circuit 520, a signal obtained by subtracting the feedback signal VFB from the base drive signal aA.

The pulse modulation circuit 520 pulse-modulates the signal output by the adder 511 to generate a modulation signal MS. The modulation signal MS is a digital signal including a potential having an L level and a potential having an H level higher than the L level. The pulse modulation circuit 520 outputs the generated modulation signal MS to the amplification circuit 550. Such a pulse modulation circuit 520 generates a pulse density modulation signal (PDM signal) obtained by modulating the signal output by the adder 511 by a pulse density modulation (PDM) method, and outputs the PDM signal as the modulation signal MS to the amplification circuit 550. Specifically, the pulse modulation circuit 520 compares a voltage of the output signal of the adder 511 with a predetermined reference voltage vref. The pulse modulation circuit 520 generates the modulation signal MS, which is at the H level when the voltage of the output signal of the adder 511 is higher than the reference voltage vref and is at the L level when the voltage of the output signal of the adder 511 is lower than the reference voltage vref, and outputs the modulation signal MS.

As described above, the circuit including the D/A conversion circuit 510, the adder 511, and the pulse modulation circuit 520 functions as the modulation circuit 500 that modulates the base drive signal dA that is a base of the drive signal COM and outputs the modulation signal MS.

The amplification circuit 550 includes a gate drive circuit 530, a diode D1, a capacitor C1, and transistors M1 and M2. The amplification circuit 550 generates a first amplified modulation signal AMS1 obtained by amplifying the modulation signal MS and outputs the first amplified modulation signal AMS1 from a first output point OP1.

The gate drive circuit 530 outputs a gate signal HGD1 and a gate signal LGD1 based on the modulation signal MS. Specifically, the modulation signal MS is input to a gate driver 531 included in the gate drive circuit 530, and the gate driver 531 generates the gate signal HGD1 obtained by level-shifting the modulation signal MS and outputs the gate signal HGD1 to the transistor M1. Moreover, the modulation signal MS is input to a gate driver 532 included in the gate drive circuit 530 after a logic level is inverted in the inverter 521, and the gate driver 532 generates the gate signal LGD1 obtained by level-shifting the signal in which the logic level of the modulation signal MS is inverted and outputs the gate signal LGD1 to the transistor M2.

Both the transistors M1 and M2 are N-channel MOSFETs. In the transistor M1, a source terminal which is one end is electrically coupled to the first output point OP1 from which the first amplified modulation signal AMS1 is output, and a voltage vhv1 of the voltage signal VHV1 is supplied as a power supply voltage to a drain terminal which is the other end. The transistor M1 operates based on the gate signal HGD1 input to a gate terminal. Moreover, in the transistor M2, a drain terminal which is one end is electrically coupled to the first output point OP1, and a ground potential is supplied to a source terminal which is the other end. The transistor M2 operates based on the gate signal LGD1 input to a gate terminal.

The transistor M1 operates based on the gate signal HGD1, and the transistor M2 operates based on the gate signal LGD1. Thus, the first amplified modulation signal AMS1 obtained by amplifying the modulation signal MS with the voltage vhv1 is generated at the first output point OP1.

Here, an operation of the gate drive circuit 530 will be described. The gate drive circuit 530 includes the gate drivers 531, and 532. As described above, the modulation signal MS is input to the gate driver 531, and the signal in which the logic level of the modulation signal MS is inverted by the inverter 521 is input to the gate driver 532. That is, the signal input to the gate driver 531 and the signal input to the gate driver 532 are exclusively at the H level. Here, a case where the signals are exclusively at the H level includes a case where the signals having the H level are not simultaneously input to the gate driver 531 and the gate driver 532. That is, a case where the signals having the L level are simultaneously input to the gate driver 531 and the gate driver 532 is not excluded.

A power supply terminal of the gate driver 531 on a low potential side is electrically coupled to the first output point OP1. Accordingly, a signal generated at the first output point OP1 is supplied as the voltage signal HVS1 to the power supply terminal of the gate driver 531 on the low potential side. Moreover, the power supply terminal of the gate driver 531 on a high potential side is electrically coupled to a cathode terminal of the diode D1 and one end of the capacitor C1. A voltage vm is supplied to an anode terminal of the diode D1, and the other end of the capacitor C1 is electrically coupled to the first output point OP1. That is, the diode D1 and the capacitor C1 constitute a bootstrap circuit, and an output voltage of the bootstrap circuit is supplied to the power supply terminal of the gate driver 531 on the high potential side. Accordingly, a voltage signal HVD1 having a voltage higher than the voltage signal HVS1 by the voltage vm input to the power supply terminal of the gate driver 531 on the low potential side is supplied to the power supply terminal of the gate driver 531 on the high potential side.

Thus, the gate driver 531 outputs the gate signal HGD1 having a voltage based on the voltage signal HVD1 having a voltage higher than a voltage at the first output point OP1 by the voltage vm when the modulation signal MS having the H level is input, and outputs the gate signal HGD1 having a voltage based on the voltage signal HVS1 which is the voltage at the first output point OP1 when the modulation signal MS having the L level is input.

Here, the voltage vm is a voltage that can drive each of the transistors M1 and M2 and transistors M3 and M4 to be described later, and is, for example, a DC voltage of 7.5 V. Such a voltage vm is generated, for example, by stepping down or boosting the voltage signals VHV1, VHV2, and VDD output by the power supply circuit 11.

A signal having a ground potential is supplied, as a voltage signal LVS1, to a power supply terminal of the gate driver 532 on the low potential side. Moreover, the voltage vm is supplied, as a voltage signal LVD1, to the power supply terminal of the gate driver 532 on the high potential side. Accordingly, the gate driver 532 outputs the gate signal LGD1 having a voltage based on the voltage signal LVD1 having the voltage vm when the signal having the H level in which the logic level of the modulation signal MS having the L level is inverted by the inverter 521 is input, and outputs the gate signal LGD1 having a voltage based on the voltage signal LVS1 having the ground potential when the signal having the L level in which the logic level of the modulation signal MS having the H level is inverted by the inverter 521 is input.

The level switching signal generation circuit 710 receives, an input, the base drive signal dA, and generates a level switching signal LS based on the base drive signal dA. The level switching signal LS is a digital signal including a potential having an L level and a potential having an H level higher than the L level. Specifically, the level switching signal generation circuit 710 generates a level switching signal LS having an H level when a value of the base drive signal dA is larger than a predetermined threshold, and generates a level switching signal LS having an L level when the value of the base drive signal dA is larger than the threshold.

The level shift circuit 750 includes a gate drive circuit 730, diodes D11 and D12, capacitors C11 and C12, transistors M3 and M4, and a bootstrap circuit BS. The level shift circuit 750 outputs, as a second amplified modulation signal AMS2, the first amplified modulation signal AMS1 or a signal obtained by shifting a potential of the first amplified modulation signal AMS1 to a second output point OP2.

The gate drive circuit 730 outputs a gate signal HGD2 for driving the transistor M3 and a gate signal LGD2 for driving the transistor M4 based on the level switching signal LS. Specifically, the level switching signal LS is input to the gate driver 731 included in the gate drive circuit 730, and the gate driver 731 generates the gate signal HGD2 obtained by level-shifting the level switching signal LS and outputs the gate signal HGD2 to the transistor M3. Moreover, the level switching signal LS is input to the gate driver 732 included in the gate drive circuit 730 after the logic level is inverted in the inverter 721, and the gate driver 732 generates the gate signal LGD2 obtained by level-shifting the signal in which the logic level of the level switching signal LS is inverted and outputs the gate signal LGD2 to the transistor M4.

Both the transistors M3 and M4 are N-channel MOS-FETs. In the transistor M3, a source terminal which is one end is electrically coupled to the second output point OP2 from which the second amplified modulation signal AMS2 is output, and a power supply voltage is supplied to a drain terminal which is the other end. Thus, the transistor M3 operates based on the gate signal HGD2 input to the gate terminal. Moreover, in the transistor M4, a drain terminal which is one end is electrically coupled to the second output point OP2, and the first amplified modulation signal AMS1 is supplied to a source terminal which is the other end. Thus, the transistor M4 operates based on the gate signal LGD2 input to a gate terminal.

The transistor M3 operates based on the gate signal HGD2, and the transistor M4 operates based on the gate signal LGD2. Thus, the first amplified modulation signal AMS1 or the signal obtained by shifting the potential of the first amplified modulation signal AMS1 is generated as the second amplified modulation signal AMS2 at the second output point OP2.

The bootstrap circuit BS includes a diode D13 and a capacitor C13. One end of the capacitor C13 is electrically coupled to the first output point OP1, the first amplified modulation signal AMS1 is supplied to the one end, and the other end is electrically coupled to the drain terminal of the transistor M3. The voltage signal VHV2 is supplied to an anode terminal of the diode D13, and a cathode terminal of the diode D13 is electrically coupled to the other end of the capacitor C13 and the drain terminal of the transistor M3. Although only one diode D13 is illustrated in FIG. 6, the bootstrap circuit BS may include a plurality of diodes D13 coupled in series. That is, the bootstrap circuit BS includes N diodes D13. N is a predetermined integer of 1 or more. Accordingly, a voltage vhv2−vf×N which is a difference between the voltage vhv2 of the voltage signal VHV2 and a sum vf×N of forward drop voltages of the N diodes D13 is supplied, as the power supply voltage, to the drain terminal of the transistor M3. When the transistor M2 of the amplification circuit 550 is energized, since charges are accumulated in the capacitor 13, a voltage between both ends of the capacitor 13 becomes the voltage vhv2−vf×N.

The bootstrap circuit BS generates a voltage signal VHV3 obtained by adding the voltage of the first amplified modulation signal AMS1 to the voltage vhv2−vf×N between both ends of the capacitor 13, and outputs the voltage signal VHV3 to the drain terminal of the transistor M3. In other words, the bootstrap circuit BS outputs the voltage signal VHV3 obtained by level-shifting the potential of the first amplified modulation signal AMS1 by the voltage vhv2−vf×N.

Here, an operation of the gate drive circuit 730 will be described. The gate drive circuit 730 includes the gate drivers 731 and 732. As described above, the level switching signal LS is input to the gate driver 731, and a signal in which the logic level of the level switching signal LS is inverted by the inverter 721 is input to the gate driver 732. That is, the signal input to the gate driver 731 and the signal input to the gate driver 732 are exclusively at the H level. Here, a case where the signals are exclusively at the H level includes a case where the signals having the H level are not simultaneously input to the gate driver 731 and the gate driver 732. That is, a case where the signals having the L level are simultaneously input to the gate driver 731 and the gate driver 732 is not excluded.

A power supply terminal of the gate driver 731 on the low potential side is coupled to the second output point OP2. Accordingly, a signal generated at the second output point OP2 is supplied as a voltage signal HVS2 to the power supply terminal of the gate driver 731 on the low potential side. Moreover, a power supply terminal of the gate driver 731 on the high potential side is electrically coupled to a cathode terminal of the diode D11 and one end of the capacitor C11. Moreover, the voltage vm is supplied to an anode terminal of the diode D11, and the other end of the capacitor C11 is electrically coupled to the second output point OP2. That is, the diode D11 and the capacitor C11 constitute a bootstrap circuit, and an output voltage of the bootstrap circuit is supplied to the power supply terminal of the gate driver 731 on the high potential side. Accordingly, a voltage signal HVD2 having a voltage higher than the voltage signal HVS2 by the voltage vm input to the power supply terminal of the gate driver 731 on the low potential side is supplied to the power supply terminal of the gate driver 731 on the high potential side. Thus, the gate driver 731 outputs the gate signal HGD2 having a voltage based on the voltage signal HVD2 having a voltage higher than a voltage at the second output point OP2 by the voltage vm when the level switching signal LS having the H level is input, and outputs the gate signal HGD2 having the voltage based on the voltage signal HVS2 which is the voltage at the second output point OP2 when the level switching signal LS having the L level is input.

A power supply terminal of the gate driver 732 on the low potential side is coupled to the first output point OP1. Accordingly, the first amplified modulation signal AMS1 generated at the first output point OP1 is supplied, as a voltage signal LVS2, to the power supply terminal of the gate driver 732 on the low potential side. Moreover, a power supply terminal of the gate driver 732 on the high potential side is electrically coupled to a cathode terminal of the diode D12 and one end of the capacitor C12. Moreover, the voltage vm is supplied to an anode terminal of the diode D12, and the other end of the capacitor C12 is electrically coupled to the first output point OP1. That is, the diode D12 and the capacitor C12 constitute a bootstrap circuit, and an output voltage of the bootstrap circuit is supplied to the power supply terminal of the gate driver 732 on the high potential side. Accordingly, a voltage signal LVD2 having a voltage higher than the voltage signal LVS2 by the voltage vm input to the power supply terminal of the gate driver 732 on the low potential side is supplied to the power supply terminal of the gate driver 732 on the high potential side.

Thus, the gate driver 732 outputs the gate signal LGD2 having a voltage based on the voltage signal LVD2 having a voltage higher than the voltage at the first output point OP1 by the voltage vm when the signal having the H level in which the logic level of the level switching signal LS having the L level is inverted by the inverter 721 is input, and outputs the gate signal HGD2 having a voltage based on the voltage signal LVS2 which is the voltage at the first output point OP1 when the signal having the L level in which the logic level of the level switching signal LS having the H level is inverted by the inverter 721.

In the level shift circuit 750 having the above-described configuration, when the level switching signal generation circuit 710 outputs the level switching signal LS having the L level, the first output point OP1 of the amplification circuit 550 and the second output point OP2 of the level shift circuit 750 are electrically coupled via the transistor M4. Accordingly, when the level switching signal LS is at the L level, the level shift circuit 750 outputs, as the second amplified modulation signal AMS2, the first amplified modulation signal AMS1 supplied to the second output point OP2 via the transistor M4.

On the other hand, when the level switching signal generation circuit 710 outputs the level switching signal LS having the H level, the first output point OP1 of the amplification circuit 550 and the second output point OP2 of the level shift circuit 750 are electrically coupled via the bootstrap circuit BS and the transistor M3. Accordingly, when the level switching signal LS is at the H level, the level shift circuit 750 outputs, as the second amplified modulation signal AMS2, the voltage signal VHV3 as a signal obtained by shifting the potential of the first amplified modulation signal AMS1 by the voltage vhv2−vf×N of the voltage signal VHV2.

In the following description, an operation mode in which the level shift circuit 750 outputs the first amplified modulation signal AMS1 as the second amplified modulation signal AMS2 is referred to as a first mode MD1, and an operation mode in which the level shift circuit 750 outputs, as the second amplified modulation signal AMS2, the signal obtained by level-shifting the potential of the first amplified modulation signal AMS1 is referred to as a second mode MD2. The level shift circuit 750 is in the first mode MD1 when the level switching signal LS is at the L level, and is in the second mode MD2 when the level switching signal LS is at the H level.

As described above, when the value of the base drive signal dA is smaller than the predetermined threshold, the level switching signal generation circuit 710 outputs the level switching signal LS having the L level, and the operation mode of the level shift circuit 750 is set to the first mode MD1. Thereafter, the value of the base drive signal dA becomes larger than the predetermined threshold, and thus, the level switching signal generation circuit 710 switches the level switching signal LS from the L level to the H level. Consequently, the operation mode of the level shift circuit 750 is switched from the second mode MD2 to the first mode MD1. In order to reduce waveform distortion of the drive signal COM that may occur due to the switching of the operation mode of the level shift circuit 750 immediately after the level switching signal LS is switched from the L level to the H level, the level switching signal generation circuit 710 outputs, as the level switching signal LS, a pulse signal that is at the L level for a short period one or a plurality of times.

On the other hand, when the value of the base drive signal dA is larger than the predetermined threshold, the level switching signal generation circuit 710 outputs the level switching signal LS having H level, and the operation mode of the level shift circuit 750 is set to the second mode MD2. Thereafter, when the value of the base drive signal dA becomes smaller than the predetermined threshold, the level switching signal generation circuit 710 switches the level switching signal LS from the H level to the L level. Consequently, the operation mode of the level shift circuit 750 is switched from the second mode MD2 to the first mode MD1. In order to reduce the waveform distortion of the drive signal COM that may occur due to the switching of the operation mode of the level shift circuit 750 immediately after the level switching signal LS is switched from the H level to the L level, the level switching signal generation circuit 710 outputs, as the level switching signal LS, a pulse signal that is at the H level for a short period one or a plurality of times.

Here, in the following description, the pulse signal that is at the L level for a short period when the operation mode of the level shift circuit 750 is switched from the first mode MD1 to the second mode MD2 and the pulse signal that is at the H level for a short period when the operation mode of the level shift circuit 750 is switched from the second mode MD2 to the first mode MD1 may be collectively referred to as a counter pulse CP.

The second amplified modulation signal AMS2 output by the level shift circuit 750 is input to the demodulation circuit 560. The demodulation circuit 560 demodulates the second amplified modulation signal AMS2 output by the level shift circuit 750 by smoothing, and outputs the drive signal COM.

The demodulation circuit 560 includes an inductor 561 and a capacitor 562. One end of the inductor 561 is electrically coupled to the second output point OP2. The other end of the inductor 561 is electrically coupled to one end of the capacitor 562. A ground potential is supplied to the other end of the capacitor 562. That is, the inductor 561 and the capacitor 562 constitute a low-pass filter circuit. Due to this low-pass filter circuit, the second amplified modulation signal AMS2 output from the level shift circuit 750 is smoothed and output, as the drive signal COM, from the drive circuit 50.

The feedback circuit 570 receives, as an input, the drive signal COM generated by the demodulation circuit 560 and outputs the feedback signal VFB to the modulation circuit 500. Specifically, the feedback circuit 570 supplies the feedback signal VFB obtained by dividing the drive signal COM to the adder 511. Consequently, the drive signal COM is fed back to the pulse modulation circuit 520. As a result, the waveform accuracy of the drive signal COM output by the drive circuit 50 is improved. Here, the feedback circuit 570 may feed back, as the feedback signal VFB, a plurality of signals including signals obtained by dividing the drive signal COM and a signal obtained by extracting high frequency components of the drive signal COM. That is, the feedback circuit 570 may include a plurality of feedback circuits including a circuit that feeds back the signals obtained by dividing the drive signal COM and a circuit that feeds back the signals obtained by extracting the high frequency components of the drive signal COM. Consequently, the high frequency components included in the drive signal COM can be individually fed back. As a result, the drive circuit 50 can be self-excited and oscillate based on the high frequency component, and a frequency of the modulation signal MS can be set to be high enough to sufficiently ensure the accuracy of the drive signal COM. Accordingly, the waveform accuracy of the drive signal COM output by the drive circuit 50 is further improved.

1-3-3. Operation of Drive Circuit

Figure 7:
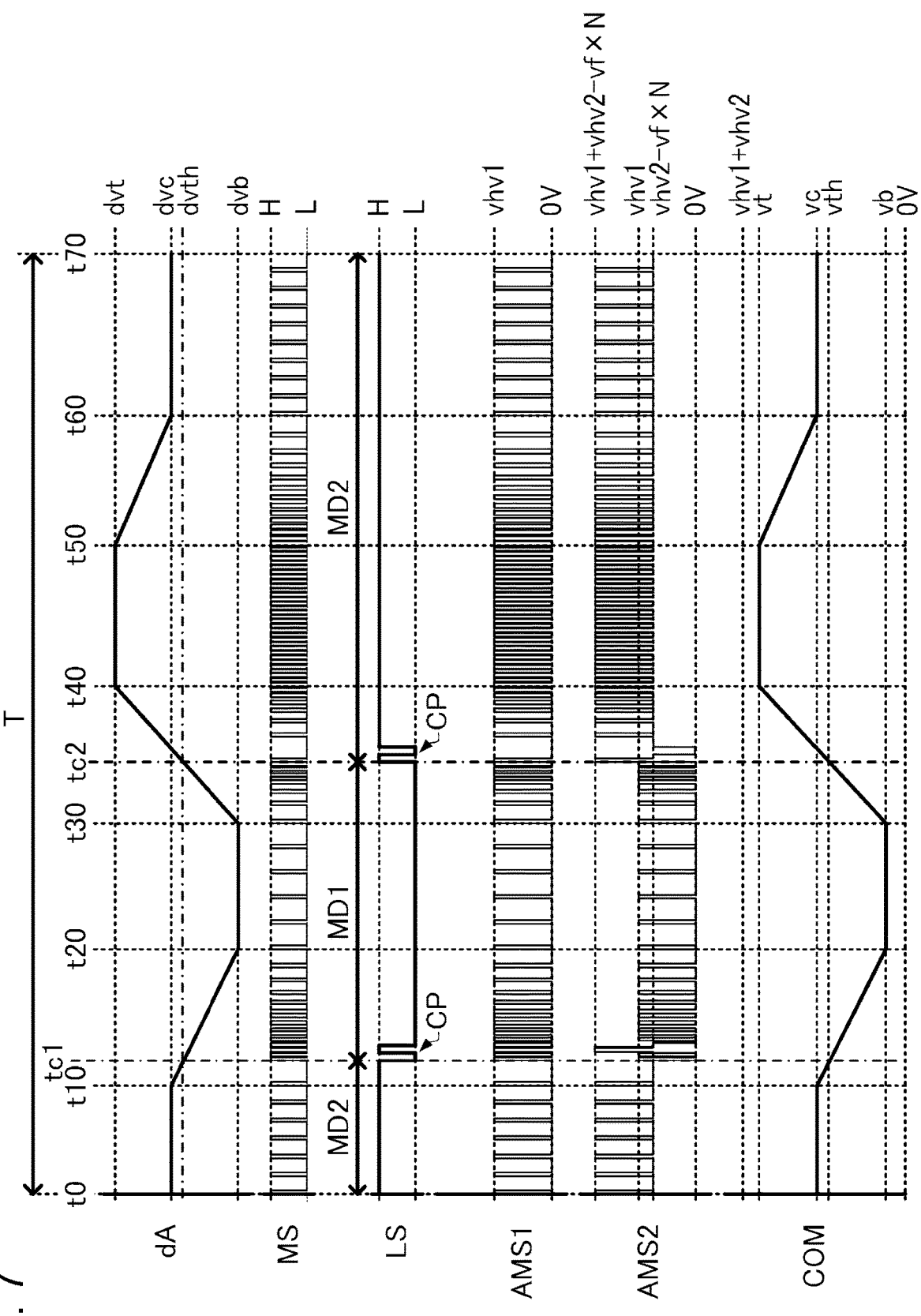
FIG. 7 is a diagram for describing an operation of the drive circuit.

Next, an operation of the drive circuit 50 will be described. FIG. 7 is a diagram for describing the operation of the drive circuit 50. In addition, FIG. 7 illustrates only the drive signal COM in any cycle T in the drive signal COM output by the drive circuit 50. In FIG. 7, for the sake of convenience in illustration and description, a signal waveform in an ideal case where there is no circuit delay or wiring delay is illustrated. Moreover, in FIG. 7, the predetermined threshold of the base drive signal dA for switching the logic level of the level switching signal LS output by the level switching signal generation circuit 710 is illustrated as dvth, and the voltage of the drive signal COM corresponding to the threshold dvth is illustrated as vth. Further, digital values of the base drive signal dA corresponding to the voltages vt, vb, and vc of the drive signal COM are illustrated as dvt, dvb, and dvc, respectively. In addition, FIG. 7 illustrates a case where the voltage vth is lower than the voltage vc and the threshold dvth is smaller than the digital value dvc, but the present disclosure is not limited thereto.

As illustrated in FIG. 7, in a period from time to to time t10, the base drive signal dA having the digital value dvc is input to the D/A conversion circuit 510, and the drive circuit 50 outputs the drive signal COM having the voltage vc. Since the digital value dvc is larger than the threshold dvth, the level switching signal generation circuit 710 generates the level switching signal LS having the H level. As a result, the operation mode of the level shift circuit 750 is set to the second mode MD2, and the level shift circuit 750 outputs, as the second amplified modulation signal AMS2, the signal obtained by shifting the potential of the first amplified modulation signal AMS1.

In a period from time t10 to time t20, the base drive signal dA that decreases from the digital value dvc to the digital value dvb is input to the D/A conversion circuit 510, and the drive circuit 50 outputs the drive signal COM that decreases from the voltage vc to the voltage vb. Within the period from time t10 to time t20, in a period from time t10 to time tc1, since the digital value of the base drive signal dA is larger than the threshold dvth, the level switching signal generation circuit 710 generates the level switching signal LS having the H level. As a result, the operation mode of the level shift circuit 750 is maintained at the second mode MD2, and the level shift circuit 750 outputs, as the second amplified modulation signal AMS2, the signal obtained by shifting the potential of the first amplified modulation signal AMS1. On the other hand, within the period from time t10 to time t20, in a period from time tc1 to time t20, since the digital value of the base drive signal dA is smaller than the threshold dvth, the level switching signal LS having the L level. As a result, the operation mode of the level shift circuit 750 transitions from the second mode MD2 to the first mode MD1, and the level shift circuit 750 outputs the first amplified modulation signal AMS1 as the second amplified modulation signal AMS2.

When the operation mode of the level shift circuit 750 transitions from the second mode MD2 to the first mode MD1, a reference potential of the first amplified modulation signal AMS1 output as the second amplified modulation signal AMS2 steeply changes from the voltage vhv2−vf×N to the ground potential. When a response speed of the drive circuit 50 cannot follow the steep change in the reference potential, there is a possibility that the signal waveform of the drive signal COM is distorted. In order to reduce the distortion of the signal waveform of the drive signal COM, after the operation mode of the level shift circuit 750 transitions from the second mode MD2 to the first mode MD1 at time tc1, the level switching signal generation circuit 710 outputs the counter pulse CP for inverting the logic level of the level switching signal LS for a short period. In a period in which the level switching signal generation circuit 710 outputs the counter pulse CP, the operation mode of the level shift circuit 750 is set to the first mode MD1 or the second mode MD2 in accordance with the logic level of the level switching signal LS, and the level shift circuit 750 outputs, as the second amplified modulation signal AMS2, the first amplified modulation signal AMS1 or the signal obtained by shifting the potential of the first amplified modulation signal AMS1. Due to the counter pulse CP, the change in the reference potential of the first amplified modulation signal AMS1 output as the second amplified modulation signal AMS2 is gradual. As a result, the distortion of the signal waveform of the drive signal COM is reduced.

As described above, in the period from time t10 to time t20, the drive circuit 50 outputs the drive signal COM that decreases from the voltage vc to the voltage vb. At this time, the charges stored in the piezoelectric element 60 and the demodulation circuit 560 are released, and a current generated by the release of the charges is supplied to the drive circuit 50. In such a period from time t10 to time t20, the level shift circuit 750 outputs the counter pulse CP, and thus, in a period in which the level switching signal LS is at the H level, the current supplied to the drive circuit 50 is supplied to the capacitor C13 via the transistor M3. That is, in the period from time t10 to time t20, the counter pulse CP is output, and thus, a regenerative current flows through the capacitor C13 of the bootstrap circuit BS. As a result, charges are stored in the capacitor C13. As a result, the possibility that the signal waveform of the drive signal COM is distorted due to the decrease in the voltage of the capacitor C13 is reduced.

In a period from time t20 to time t30, the base drive signal dA having the digital value dvb is input to the D/A conversion circuit 510, and the drive circuit 50 outputs the drive signal COM having the voltage vb. Since the digital value dvb is smaller than the threshold dvth, the level switching signal generation circuit 710 generates the level switching signal LS having the L level. As a result, the operation mode of the level shift circuit 750 is maintained at the first mode MD1, and the level shift circuit 750 outputs the first amplified modulation signal AMS1 as the second amplified modulation signal AMS2.

In a period from time t30 to time t40, the base drive signal dA that increases from the digital value dvb to the digital value dvt is input to the D/A conversion circuit 510, and the drive circuit 50 outputs the drive signal COM that rises from the voltage vb to the voltage vt. Within the period from time t30 to time t40, in a period from time t30 to time tc2, since the digital value of the base drive signal dA is smaller than the threshold dvth, the level switching signal generation circuit 710 generates the level switching signal LS having the L level. As a result, the operation mode of the level shift circuit 750 is maintained at the first mode MD1, and the level shift circuit 750 outputs the first amplified modulation signal AMS1 as the second amplified modulation signal AMS2. On the other hand, within the period from time t30 to time t40, in a period from time tc2 to time t40, since the digital value of the base drive signal dA is larger than the threshold dvth, the level switching signal generation circuit 710 generates the level switching signal LS having the H level. As a result, the operation mode of the level shift circuit 750 transitions from the first mode MD1 to the second mode MD2, and the level shift circuit 750 outputs, as the second amplified modulation signal AMS2, the signal obtained by shifting the potential of the first amplified modulation signal AMS1.

When the operation mode of the level shift circuit 750 transitions from the first mode MD1 to the second mode MD2, the reference potential of the first amplified modulation signal AMS1 output as the second amplified modulation signal AMS2 steeply changes from the ground potential to the voltage vhv2–vf×N. When a response speed of the drive circuit 50 cannot follow the steep change in the reference potential, there is a possibility that the signal waveform of the drive signal COM is distorted. In order to reduce the distortion of the signal waveform of the drive signal COM, at time tc2, after the operation mode of the level shift circuit 750 transitions from the first mode MD1 to the second mode MD2, the level switching signal generation circuit 710 outputs the counter pulse CP for inverting the logic level of the level switching signal LS for a short period. In a period in which the level switching signal generation circuit 710 outputs the counter pulse CP, the operation mode of the level shift circuit 750 is set to the first mode MD1 or the second mode MD2 in accordance with the logic level of the level switching signal LS, and the level shift circuit 750 outputs, as the second amplified modulation signal AMS2, the first amplified modulation signal AMS1 or the signal obtained by shifting the potential of the first amplified modulation signal AMS1. Due to the counter pulse CP, the change in the reference potential of the first amplified modulation signal AMS1 output as the second amplified modulation signal AMS2 is gradual. As a result, the distortion of the signal waveform of the drive signal COM is reduced.

As described above, in the period from time t30 to time t40, the drive circuit 50 outputs the drive signal COM that increases from the voltage vb to the voltage vt. At this time, a current is supplied to the piezoelectric element 60 and the demodulation circuit 560 by the second amplified modulation signal AMS2 output by the drive circuit 50, and charges are stored. The current for storing the charges in the piezoelectric element 60 and the demodulation circuit 560 is supplied via the capacitor C13. Thus, the charges stored in the capacitor C13 are released, and the possibility that the voltage of the capacitor C13 decreases is increased. In the period from time t30 to time t40, the level shift circuit 750 outputs the counter pulse CP, and thus, in a period in which the level switching signal LS is at the L level, the current is supplied to the piezoelectric element 60 and the demodulation circuit 560 without passing through the capacitor C13. That is, in the period from time t30 to time t40, the counter pulse CP is output, and thus, the possibility that the charges stored in the capacitor C13 of the bootstrap circuit BS are released is reduced. As a result, the possibility that the signal waveform of the drive signal COM is distorted due to the decrease in the voltage of the capacitor C13 is reduced.

In a period from time t40 to time t50, the base drive signal dA having the digital value dvt is input to the D/A conversion circuit 510, and the drive circuit 50 outputs the drive signal COM having the voltage vt. Since the digital value dvt is larger than the threshold dvth, the level switching signal generation circuit 710 generates the level switching signal LS having the H level. As a result, the operation mode of the level shift circuit 750 is maintained at the second mode MD2, and the level shift circuit 750 outputs, as the second amplified modulation signal AMS2, the signal obtained by shifting the potential of the first amplified modulation signal AMS1.

In a period from time t50 to time t60, the base drive signal dA that decreases from the digital value dvt to the digital value dvc is input to the D/A conversion circuit 510, and the drive circuit 50 outputs the drive signal COM that decreases from the voltage vt to the voltage vc.

In a period from time t60 to time t70, the base drive signal dA having the digital value dvc is input to the D/A conversion circuit 510, and the drive circuit 50 outputs the drive signal COM having the voltage vc. Since the digital value dvc is larger than the threshold dvth, the level switching signal generation circuit 710 generates the level switching signal LS having the H level. As a result, the operation mode of the level shift circuit 750 is maintained at the second mode MD2, and the level shift circuit 750 outputs, as the second amplified modulation signal AMS2, the signal obtained by shifting the potential of the first amplified modulation signal AMS1.

1-3-4. Operation of Level Switching Signal Generation Circuit

As described above, when the level switching signal LS is at the L level, the transistor M3 is unenergized, and the transistor M4 is energized. At this time, when the modulation signal MS changes from the L level to the H level, the transistor M1 is energized, and the transistor M2 is unenergized. Thus, the voltage of the first amplified modulation signal AMS1 changes from the ground potential to the voltage vhv1. The current for storing the charges in the capacitor 562 of the demodulation circuit 560 flows through the transistor M1, the first output point OP1, the transistor M4, and the second output point OP2. Moreover, when the level switching signal LS is at the L level and when the modulation signal MS changes from the H level to the L level, the transistor M1 is unenergized, and the transistor M2 is energized. Thus, the voltage of the first amplified modulation signal AMS1 changes from the voltage vhv1 to the ground potential. The current for releasing the charges stored in the capacitor 562 flows through the second output point OP2, the transistor M4, the first output point OP1, and the transistor M2.

On the other hand, when the level switching signal LS is at the H level, the transistor M3 is energized, and the transistor M4 is unenergized. At this time, when the modulation signal MS changes from the L level to the H level, the transistor M1 is energized, and the transistor M2 is unenergized. Thus, the voltage of the first amplified modulation signal AMS1 changes from the ground potential to the voltage vhv1. Then, the current for storing the charges in the capacitor 562 flows through the transistor M1, the first output point OP1, the transistor M3, and the second output point OP2. Moreover, when the level switching signal LS is at the H level and when the modulation signal MS changes from the H level to the L level, the transistor M1 is unenergized, and the transistor M2 is energized. Thus, the voltage of the first amplified modulation signal AMS1 changes from the voltage vhv1 to the ground potential. The current for releasing the charges stored in the capacitor 562 flows through the second output point OP2, the transistor M3, the first output point OP1, and the transistor M2.

Figure 8:
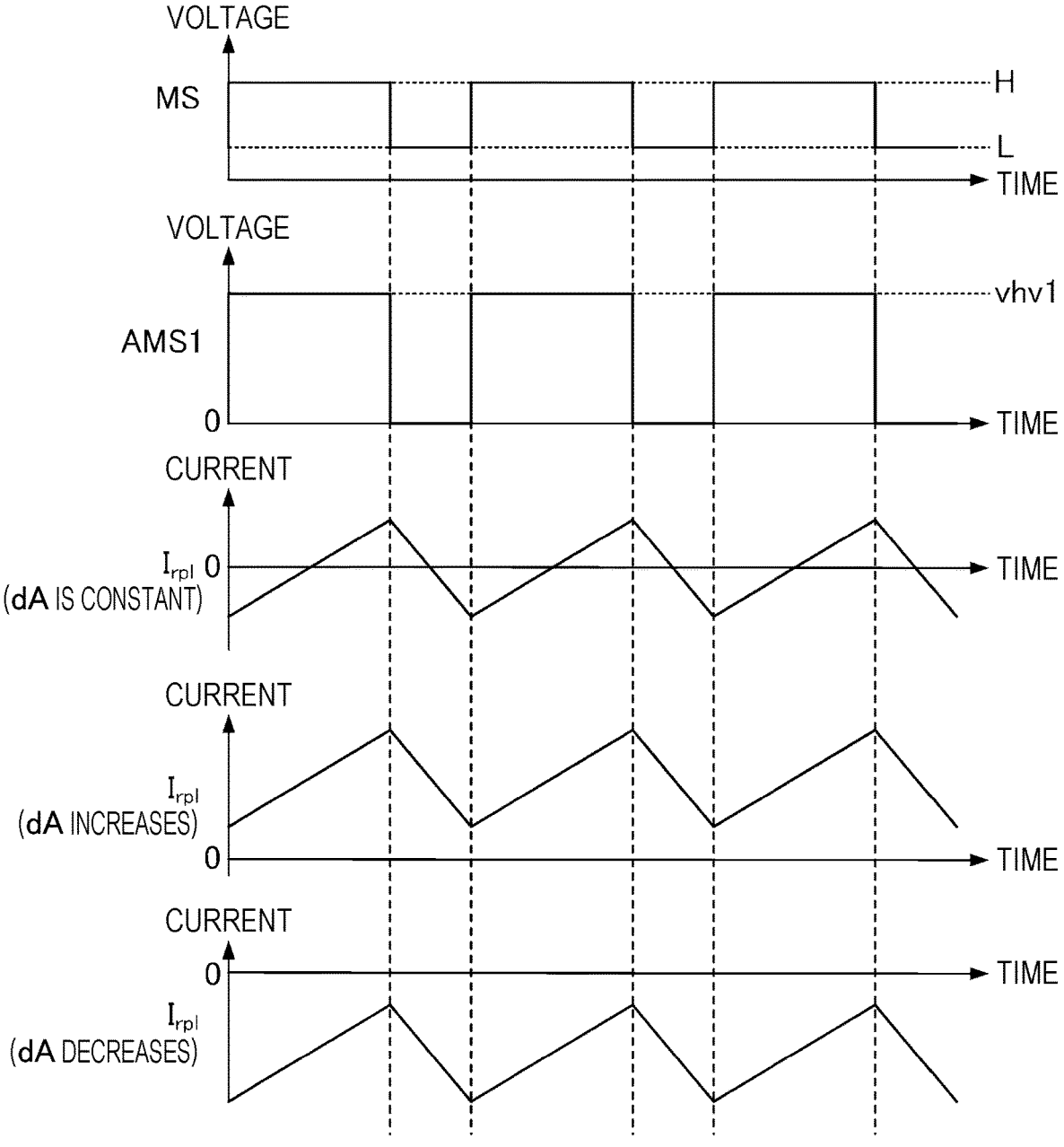
FIG. 8 is a graph for describing a ripple current.

As described above, regardless of whether the level switching signal LS is at the L level or the H level, since the current flowing through the second output point OP2 increases or decreases whenever the logic level of the modulation signal MS changes, the current becomes a ripple current $I_{rpl}$. When the digital value of the base drive signal dA is constant, the ripple current $I_{rpl}$ increases or decreases around zero in accordance with the logic level of the modulation signal MS as illustrated in FIG. 8 such that the drive signal COM is a constant voltage. Moreover, when the digital value of the base drive signal dA increases, the ripple current $I_{rpl}$ increases or decreases around a positive value in accordance with the logic level of the modulation signal MS, as illustrated in FIG. 8, such that the voltage of the drive signal COM rises. Moreover, when the digital value of the base drive signal dA decreases, the ripple current $I_{rpl}$ increases or decreases around a negative value in accordance with the logic level of the modulation signal MS, as illustrated in FIG. 8, such that the voltage of the drive signal COM decreases.

As described above, when the level switching signal LS transitions from the L level to the H level, the transistor M3 transitions from non-energization to energization. At this time, since a time duration until the transistor M3 is completely energized is not zero, a product of a drain current of the transistor M3 and a drain-source voltage in this transition period is a switching loss of the transistor M3. Accordingly, the larger the drain current of the transistor M3, the larger the switching loss. Moreover, when the level switching signal LS transitions from the H level to the L level, the transistor M4 transitions from non-energization to energization. At this time, since a time duration until the transistor M4 is completely energized is not zero, a product of a drain current of the transistor M4 and a drain-source voltage in this transition period is a switching loss of the transistor M4. Accordingly, the larger the drain current of the transistor M4, the larger the switching loss.

Since both the drain currents of the transistors M3 and M4 are the ripple current $I_{rpl}$, when an absolute value of the ripple current $I_{rpl}$ is the minimum, and when the transistors M3 and M4 transition from the non-energization to energization, the switching losses of the transistors M3 and M4 are minimized. A timing at which the transistor M3 transitions from non-energization to energization is a timing at which the level switching signal LS transitions from the L level to the H level, and a timing at which the transistor M4 transitions from non-energization to energization is a timing at which the level switching signal LS transitions from the H level to the L level. Accordingly, when the absolute value of the ripple current $I_{rpl}$ is the minimum, and when the logic level of the level switching signal LS changes, the switching losses of the transistors M3 and M4 are minimized.

As illustrated in FIG. 8, the ripple current $I_{rpl}$ increases in a period in which the modulation signal MS is at the H level, and the ripple current $I_{rpl}$ decreases in a period in which the modulation signal MS is at the L level. That is, the increase and decrease of the ripple current $I_{rpl}$ are switched in synchronization with the modulation signal MS. As a result, the ripple current $I_{rpl}$ is maximized at a timing at which the modulation signal MS changes from the H level to the L level, and the ripple current $I_{rpl}$ is minimized at a timing at which the modulation signal MS changes from the L level to the H level. In a period in which the value of the base drive signal dA increases, since the ripple current $I_{rpl}$ is a positive value, the absolute value of the ripple current $I_{rpl}$ is maximized when the ripple current $I_{rpl}$ is maximum, and the absolute value of the ripple current $I_{rpl}$ is minimized when the ripple current $I_{rpl}$ is minimized. On the other hand, in a period in which the value of the base drive signal dA decreases, since the ripple current $I_{rpl}$ is a negative value, the absolute value of the ripple current $I_{rpl}$ is maximized when the ripple current $I_{rpl}$ is minimum, and the absolute value of the ripple current $I_{rpl}$ is minimized when the ripple current $I_{rpl}$ is maximum. That is, in the period in which the value of the base drive signal dA increases, the absolute value of the ripple current $I_{rpl}$ is maximized at the falling at which the modulation signal MS changes from the H level to the L level, and the absolute value of the ripple current $I_{rpl}$ is minimized at the rising at which the modulation signal MS changes from the L level to the H level. Moreover, in the period in which the value of the base drive signal dA decreases, the absolute value of the ripple current $I_{rpl}$ is maximized at the rising at which the modulation signal MS changes from the L level to the H level, and the absolute value of the ripple current $I_{rpl}$ is minimized at the falling at which the modulation signal MS changes from the H level to the L level. Therefore, in the present embodiment, in order to reduce the switching losses of the transistors M3 and M4, the level switching signal generation circuit 710 switches the potential of the level switching signal LS in response to the base drive signal dA and the modulation signal MS.

Figure 9:
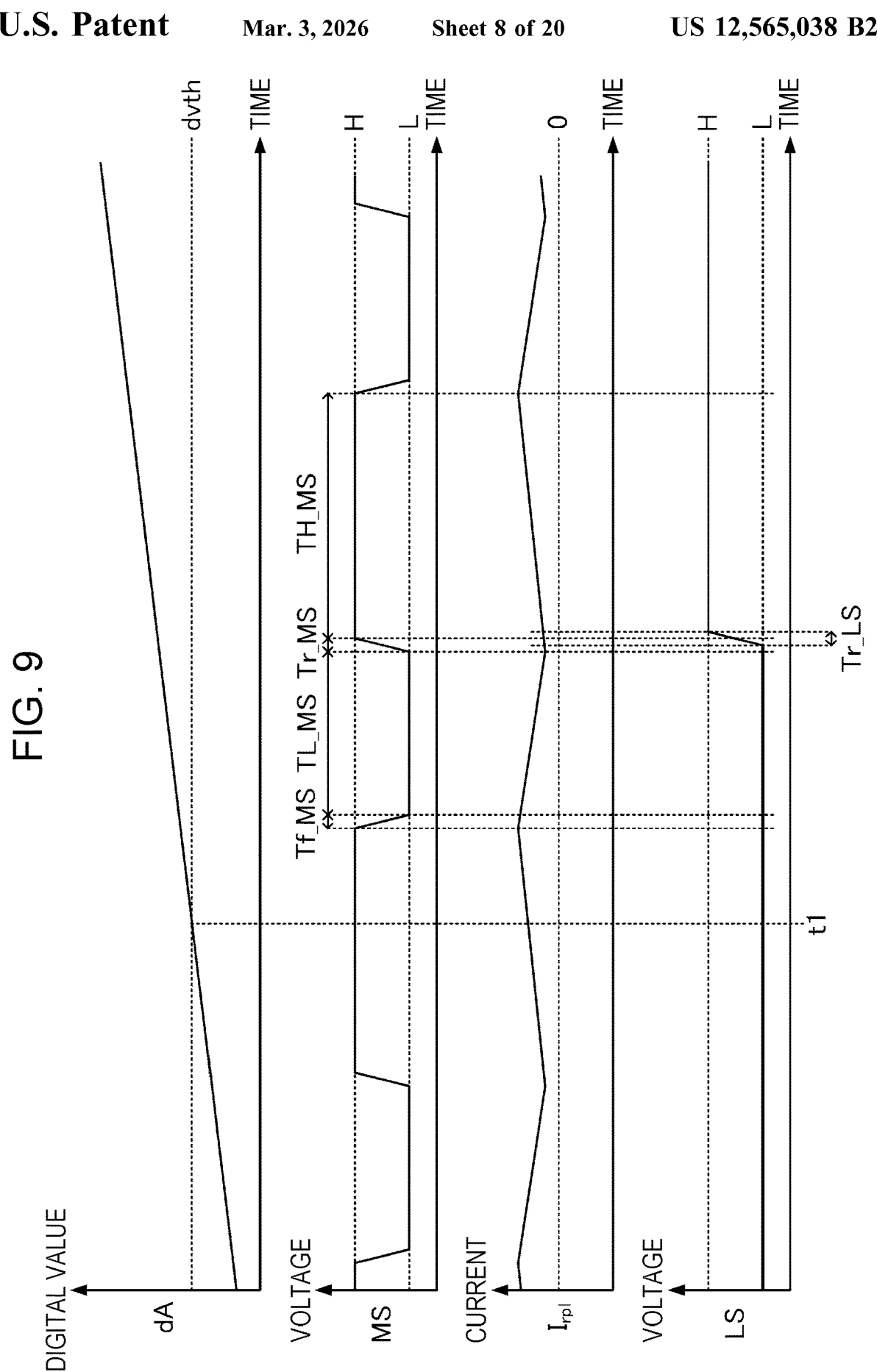
FIG. 9 is a diagram illustrating an example of a timing at which a level switching signal is switched from an L level to an H level.
Figure 10:
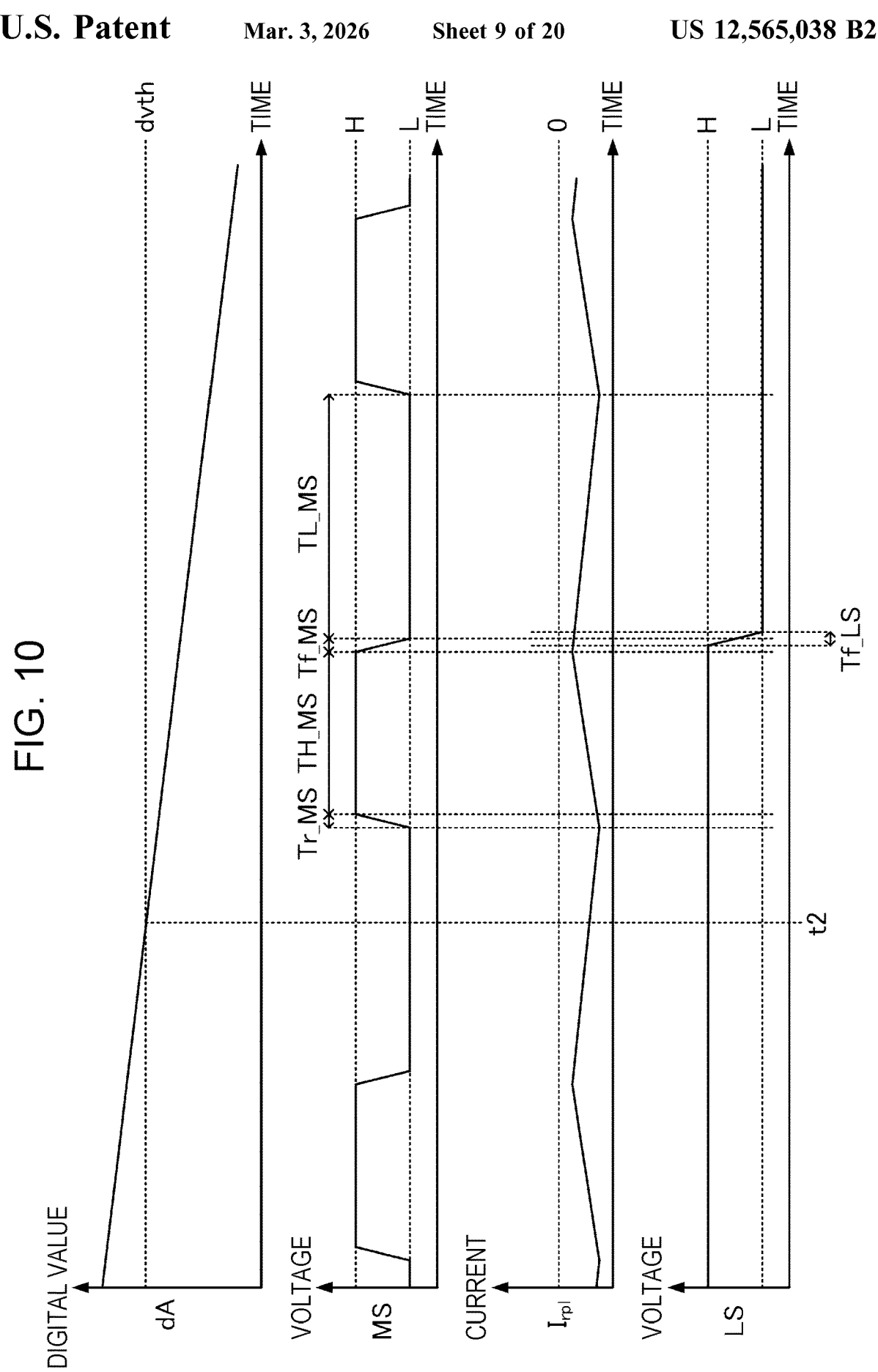
FIG. 10 is a diagram illustrating an example of a timing at which a level switching signal is switched from the H level to the L level.

FIG. 9 illustrates an example of a timing at which the level switching signal LS is switched from the L level to the H level when the base drive signal dA increases. Moreover, FIG. 10 illustrates an example of a timing at which the level switching signal LS is switched from the H level to the L level when the base drive signal dA decreases. As illustrated in FIGS. 9 and 10, in general, in a period in which the base drive signal dA increases or decreases, a period Tf_MS in which the modulation signal MS transitions from the H level to the L level and a period Tr_MS in which the modulation signal MS transitions from the L level to the H level are sufficiently shorter than a period TL MS in which the modulation signal MS is at the L level and a period TH MS in which the modulation signal MS is at the H level, for example, one tenth. Thus, the ripple current $I_{rpl}$ can be regarded as a constant current in the period Tf_MS and the period Tr_MS.

As illustrated in FIG. 9, in the period in which the base drive signal dA increases, the absolute value of the ripple current $I_{rpl}$ is maximized in the period Tf_MS, and the absolute value of the ripple current $I_{rpl}$ is minimized in the period Tr_MS. In the present embodiment, in the period in which the base drive signal dA increases, the period Tf_MS in which the modulation signal MS transitions from the H level to the L level and the period Tr_LS in which the level switching signal LS transitions from the L level to the H level are different from each other. That is, the level switching signal generation circuit 710 avoids a timing at which the absolute value of the ripple current $I_{rpl}$ is maximized, and switches the level switching signal LS from the L level to the H level. Consequently, a timing at which the switching loss of the transistor M3 is maximized is avoided, and the level switching signal LS is switched from the L level to the H level.

The level switching signal generation circuit 710 may switch the potential of the level switching signal LS from the L level to the H level in synchronization with the rising of the modulation signal MS in the period in which the base drive signal dA increases. Specifically, after time t1 at which the base drive signal dA increases and reaches the threshold dvth, the potential of the level switching signal LS is switched from the L level to the H level in synchronization with the first rising of the modulation signal MS. In reality, due to a circuit delay or the like of the level switching signal generation circuit 710, a timing at which the level switching signal LS starts transitioning from the L level to the H level is delayed with respect to the rising of the modulation signal MS. Thus, the period Tr_MS in which the modulation signal MS transitions from the L level to the H level and the period Tr_LS in which the level switching signal LS transitions from the L level to the H level at least partially overlap each other. That is, the level switching signal generation circuit 710 switches the level switching signal LS from the L level to the H level near a timing at which the absolute value of the ripple current $I_{rpl}$ is minimized. Consequently, the level switching signal LS is switched from the L level to the H level near a timing at which the switching loss of the transistor M3 is minimized.

Moreover, as illustrated in FIG. 10, in the period in which the base drive signal dA decreases, the absolute value of the ripple current $I_{rpl}$ is maximized in the period Tr_MS, and the absolute value of the ripple current $I_{rpl}$ is minimized in the period Tf_MS. In the present embodiment, in the period in which the base drive signal dA decreases, the period Tr_MS in which the modulation signal MS transitions from the L level to the H level and the period Tf_LS in which the level switching signal LS transitions from the H level to the L level are different from each other. That is, the level switching signal generation circuit 710 avoids the timing at which the absolute value of the ripple current $I_{rpl}$ is maximized, and switches the level switching signal LS from the H level to the L level. Consequently, a timing at which the switching loss of the transistor M4 is maximized is avoided, and the level switching signal LS is switched from the H level to the L level.

The level switching signal generation circuit 710 may switch the potential of the level switching signal LS from the H level to the L level in synchronization with the falling of the modulation signal MS in the period in which the base drive signal dA decreases. Specifically, after time t2 at which the base drive signal dA decreases and reaches the threshold dvth, the potential of the level switching signal LS is switched from the H level to the L level in synchronization with the first falling of the modulation signal MS. In reality, due to the circuit delay or the like of the level switching signal generation circuit 710, a timing at which the level switching signal LS starts transitioning from the H level to the L level is delayed with respect to the falling of the modulation signal MS. Thus, the period Tf_MS in which the modulation signal MS transitions from the H level to the L level and the period Tf_LS in which the level switching signal LS transitions from the H level to the L level at least partially overlap each other. That is, the level switching signal generation circuit 710 switches the level switching signal LS from the H level to the L level near the timing at which the absolute value of the ripple current $I_{rpl}$ is minimized. Consequently, the level switching signal LS is switched from the H level to the L level near a timing at which the switching loss of the transistor M4 is minimized.

1-4. Actions and Effects

As described above, in the liquid ejecting apparatus 1 of the first embodiment, in the drive circuit 50, the amplification circuit 550 generates the first amplified modulation signal AMS1 in which the modulation signal MS is amplified by switching operations of the transistors M1 and M2. The level shift circuit 750 outputs, as the second amplified modulation signal AMS2, the first amplified modulation signal AMS1 or the signal obtained by shifting the potential of the first amplified modulation signal AMS1 in accordance with the potential of the level switching signal LS via the transistors M3 and M4. The demodulation circuit 560 demodulates the second amplified modulation signal AMS2 and outputs the drive signal COM. Accordingly, due to the switching operations of the transistors M1 and M2, the ripple current $I_{rpl}$ flowing through the demodulation circuit 560 via the transistors M3 and M4 increases and decreases in synchronization with the modulation signal MS. Thus, the level switching signal generation circuit 710 can cause the transistors M3 and M4 to perform the switching operations when the ripple current $I_{rpl}$ is not large by performing the switching of the potential of the level switching signal LS based on the base drive signal dA at an appropriate timing based on the modulation signal MS. Accordingly, according to the liquid ejecting apparatus 1 of the first embodiment, the switching losses by the transistors M3 and M4 can be reduced in the drive circuit 50.

Moreover, in the liquid ejecting apparatus 1 of the first embodiment, in the drive circuit 50, the level switching signal generation circuit 710 can cause the transistors M3 and M4 to perform the switching operations when the ripple current $I_{rpl}$ is relatively small by switching the level switching signal LS from the L level to the H level in synchronization with the rising of the modulation signal MS at which the ripple current $I_{rpl}$ is minimized in the period in which the value of the base drive signal dA increases. For example, the level switching signal generation circuit 710 can cause the transistors M3 and M4 to avoid the timing at which the ripple current $I_{rpl}$ is maximized and perform the switching operations by switching the level switching signal LS from the L level to the H level in the period Tr_LS different from the period Tf_MS in which the ripple current $I_{rpl}$ is maximized in the period in which the value of the base drive signal dA increases. Further, the level switching signal generation circuit 710 can cause the transistors M3 and M4 to perform the switching operations at a timing at which the ripple current $I_{rpl}$ is close to minimum by switching the level switching signal LS from the L level to the H level in the period Tr_LS at least partially overlapping the period Tr_MS in which the ripple current $I_{rpl}$ is minimized in the period in which the value of the base drive signal dA increases. Accordingly, according to the liquid ejecting apparatus 1 of the first embodiment, in the drive circuit 50, the switching losses by the transistors M3 and M4 can be reduced when the level switching signal LS is switched from the L level to the H level.

Moreover, in the liquid ejecting apparatus 1 of the first embodiment, in the drive circuit 50, the level switching signal generation circuit 710 can cause the transistors M3 and M4 to perform the switching operations when the ripple current $I_{rpl}$ is relatively small by switching the level switching signal LS from the H level to the L level in synchronization with the falling of the modulation signal MS at which the ripple current $I_{rpl}$ is minimized in the period in which the value of the base drive signal dA decrease. For example, the level switching signal generation circuit 710 can cause the transistors M3 and M4 to avoid the timing at which the ripple current $I_{rpl}$ is maximized and perform the switching operations by switching the level switching signal LS from the H level to the L level in the period Tf_LS different from the period Tr_MS in which the ripple current $I_{rpl}$ is maximized in the period in which the value of the base drive signal dA decreases. Further, the level switching signal generation circuit 710 can cause the transistors M3 and M4 to perform the switching operations at the timing at which the ripple current $I_{rpl}$ is close to minimum by switching the level switching signal LS from the H level to the L level in the period Tf_LS at least partially overlapping the period Tf_MS in which the ripple current $I_{rpl}$ is minimized in the period in which the value of the base drive signal dA decreases. Accordingly, according to the liquid ejecting apparatus 1 of the first embodiment, in the drive circuit 50, the switching losses by the transistors M3 and M4 can be reduced when the level switching signal LS is switched from the H level to the L level.

2. Second Embodiment

Hereinafter, components of a second embodiment similar to the first embodiment will be given the same reference numerals, the description overlapping with the first embodiment will be omitted or simplified, and contents different from the first embodiment will be mainly described.

Figure 11:
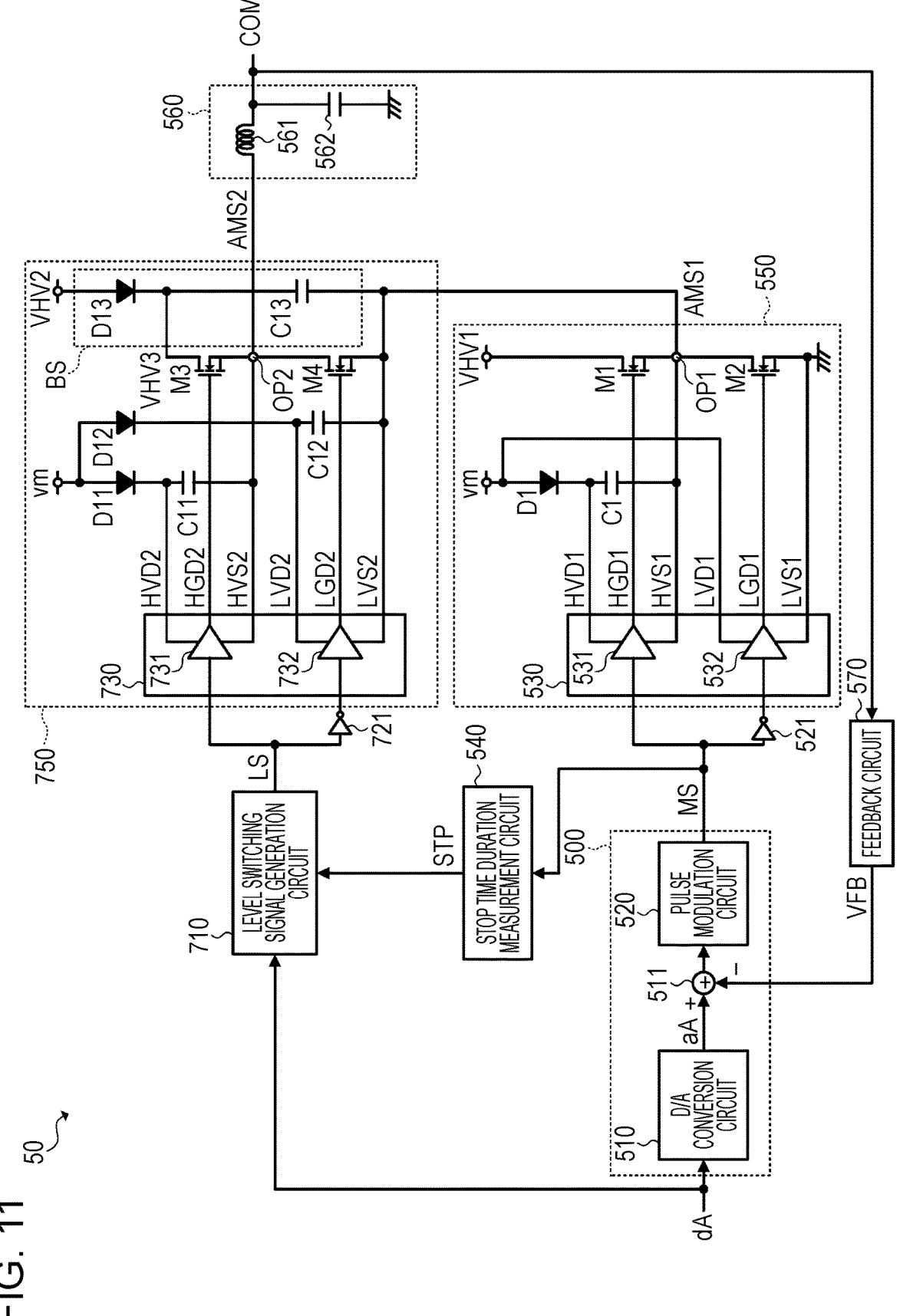
FIG. 11 is a diagram illustrating an example of a functional configuration of a drive circuit according to a second embodiment.

FIG. 11 is a diagram illustrating an example of a functional configuration of a drive circuit 50 included in the liquid ejecting apparatus 1 of the second embodiment. As illustrated in FIG. 11, as in the first embodiment, the drive circuit 50 according to the second embodiment includes a D/A conversion circuit 510, an adder 511, a pulse modulation circuit 520, an inverter 521, an amplification circuit 550, a demodulation circuit 560, a feedback circuit 570, a level switching signal generation circuit 710, and a level shift circuit 750. Since configurations and functions of the D/A conversion circuit 510, the adder 511, the pulse modulation circuit 520, the inverter 521, the amplification circuit 550, the demodulation circuit 560, the feedback circuit 570, and the level shift circuit 750 are similar to the first embodiment, the description thereof will be omitted.

The drive circuit 50 according to the second embodiment further includes a stop time duration measurement circuit 540. The stop time duration measurement circuit 540 outputs a stop time duration measurement signal STP to the level switching signal generation circuit 710 in response to the modulation signal MS. Specifically, the stop time duration measurement circuit 540 measures a first time duration T1 in which the modulation signal MS is constant at an L level, and inverts a logic level of the stop time duration measurement signal STP when the first time duration T1 exceeds a predetermined time duration TU1. For example, the stop time duration measurement circuit 540 may measure the first time duration T1 by counting the number of times the modulation signal MS is continuously at an L level at an edge of a clock signal (not illustrated) in synchronization with an update cycle of the base drive signal dA, and may determine that the first time duration T1 exceeds the predetermined time duration TU1 when the count value reaches a predetermined value.

Moreover, the stop time duration measurement circuit 540 measures a second time duration T2 in which the modulation signal MS is constant at an H level, and inverts the logic level of the stop time duration measurement signal STP when the second time duration T2 exceeds a predetermined time duration TU2. For example, the stop time duration measurement circuit 540 measures the second time duration T2 by counting the number of times the modulation signal MS is continuously at the H level at the edge of the clock signal (not illustrated) in synchronization with the update cycle of the base drive signal dA, and may determine that the second time duration T2 exceeds the predetermined time duration TU2 when the count value reaches a predetermined value.

The predetermined time duration TU1 and the predetermined time duration TU2 may be the same length or different lengths. The stop time duration measurement circuit 540 may invert the stop time duration measurement signal STP from the L level to the H level and then further invert the stop time duration measurement signal STP from the H level to the L level. That is, the stop time duration measurement circuit 540 may output the stop time duration measurement signal STP having a high pulse. The stop time duration measurement circuit 540 starts measuring a next first time duration T1 or second time duration T2 from a timing at which the stop time duration measurement signal STP is inverted from the H level to the L level.

As in the first embodiment, the level switching signal generation circuit 710 receives, as an input, the base drive signal dA, generates a level switching signal LS based on the base drive signal dA, and outputs the level switching signal LS to the gate drive circuit 730. The level switching signal LS is a digital signal including a potential having an L level and a potential having an H level higher than the L level. Specifically, the level switching signal generation circuit 710 generates a level switching signal LS having an H level when a value of the base drive signal dA is larger than a predetermined threshold, and generates a level switching signal LS having an L level when the value of the base drive signal dA is smaller than the threshold. Further, in the second embodiment, the level switching signal generation circuit 710 switches a potential of the level switching signal LS in response to the base drive signal dA and the stop time duration measurement signal STP. Specifically, the level switching signal generation circuit 710 switches the potential of the level switching signal LS in accordance with the inversion of the logic level of the stop time duration measurement signal STP.

Figure 12:
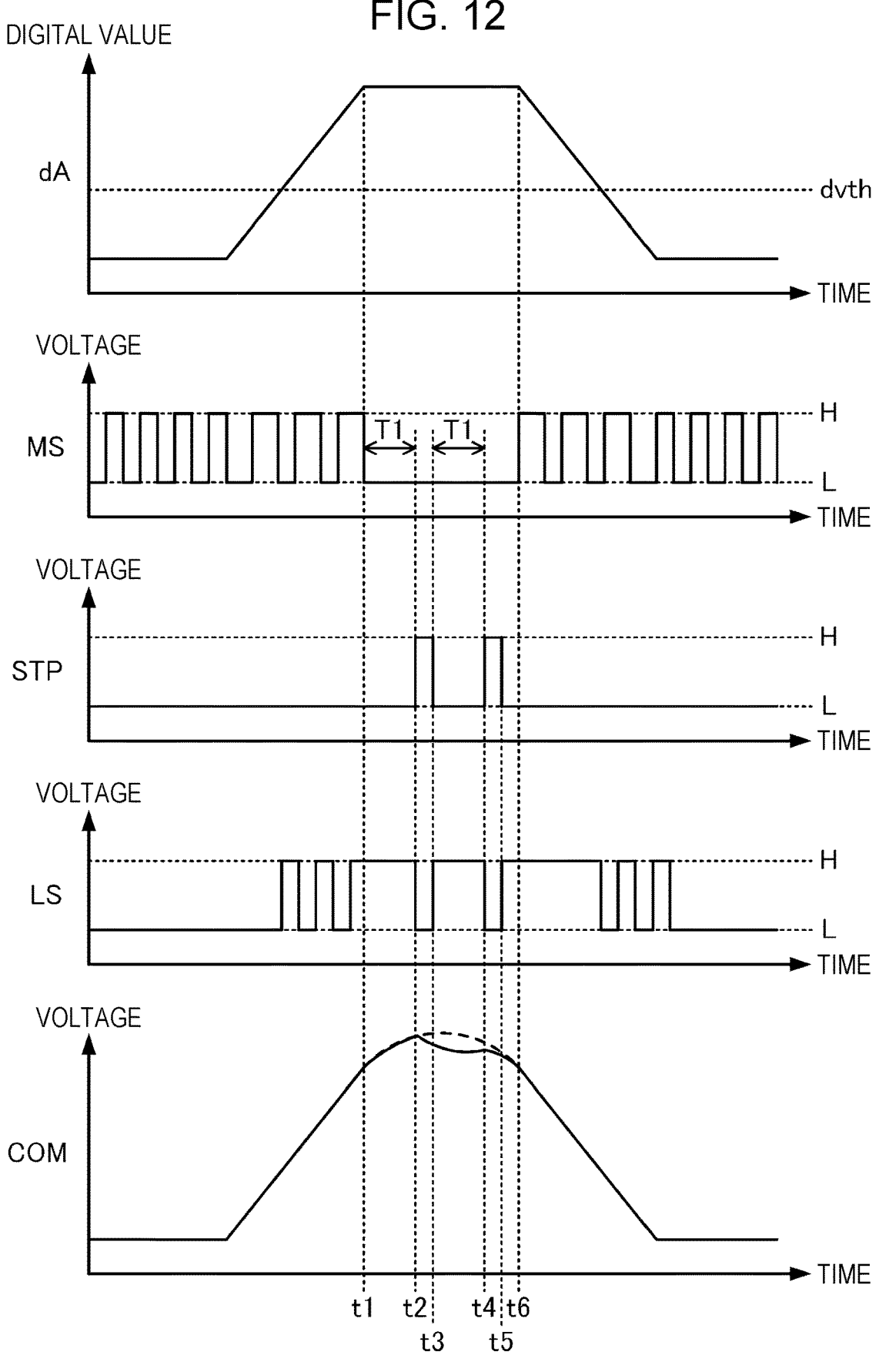
FIG. 12 is a diagram illustrating an example of waveforms of a base drive signal, a modulation signal, a stop time duration measurement signal, a level switching signal, and a drive signal according to the second embodiment.

FIG. 12 illustrates an example of waveforms of the base drive signal dA, the modulation signal MS, the stop time duration measurement signal STP, the level switching signal LS, and the drive signal COM. In addition, in reality, a voltage change of the drive signal COM is delayed with respect to a change in the value of the base drive signal dA. However, in FIG. 12, for the sake of convenience in illustration and description, the waveform of the drive signal COM is illustrated as having no delay.

In the example of FIG. 12, the modulation signal MS is maintained at the L level in a period from time t1 to time t6 in which the base drive signal dA is a constant value larger than a threshold dvth. Thus, at time t2 at which the first time duration T1 in which the modulation signal MS is constant at the L level exceeds the predetermined time duration TU1, the stop time duration measurement signal STP is inverted from the L level to the H level, and at time t3, the stop time duration measurement signal STP is further inverted from the H level to the L level. As a result, at time t2, the level switching signal LS transitions from the H level to the L level, and at time t3, the level switching signal LS transitions from the L level to the H level. Thereafter, at time t4 at which the first time duration T1 in which the modulation signal MS is constant at the L level exceeds the predetermined time duration TU1, the stop time duration measurement signal STP is further inverted from the L level to the H level, and at time t5, the stop time duration measurement signal STP is further inverted from the H level to the L level. As a result, at time t4, the level switching signal LS transitions from the H level to the L level, and at time t5, the level switching signal LS transitions from the L level to the H level. That is, in a period from time t2 to time t3 and a period from time t4 to time t5 in which the stop time duration measurement signal STP is at the H level, level switching signals LS having an L pulse are generated. When the level switching signals LS having the L pulse are not generated, as illustrated by a broken line in FIG. 12, a large overshoot occurs in the drive signal COM, and it takes a time duration to reduce the overshoot. By contrast, the level switching signals LS having the L pulse are generated, and thus, as illustrated by a solid line in FIG. 12, the overshoot occurred in the drive signal COM is reduced, and the time duration until the overshoot is reduced is shortened.

Figure 13:
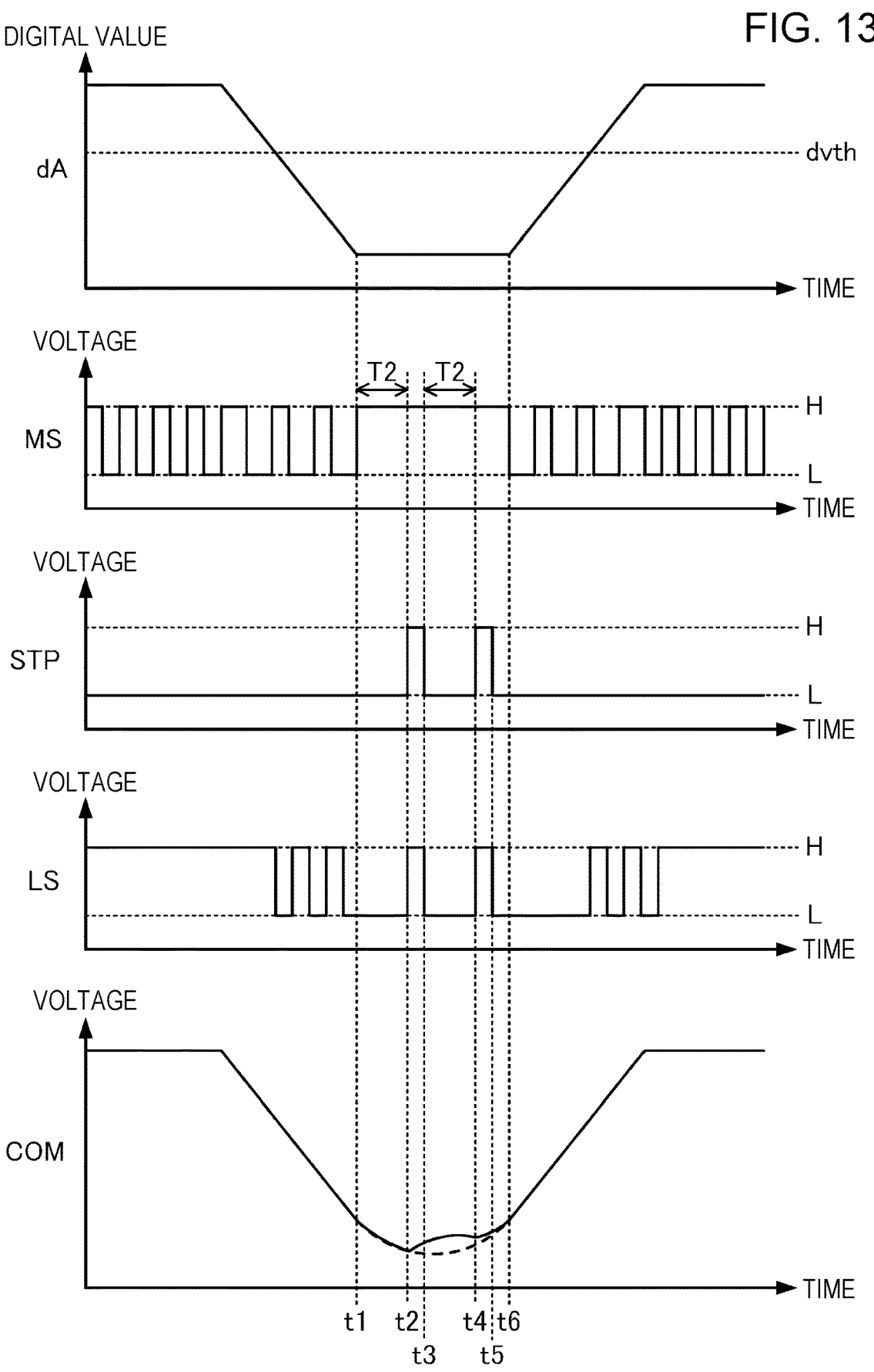
FIG. 13 is a diagram illustrating another example of the waveforms of the base drive signal, the modulation signal, the stop time duration measurement signal, the level switching signal, and the drive signal according to the second embodiment.

FIG. 13 illustrates another example of the waveforms of the base drive signal dA, the modulation signal MS, the stop time duration measurement signal STP, the level switching signal LS, and the drive signal COM. In addition, in reality, a voltage change of the drive signal COM is delayed with respect to a change in the value of the base drive signal dA.

However, in FIG. 13, for the sake of convenience in illustration and description, the waveform of the drive signal COM is illustrated as having no delay. In the example of FIG. 13, the modulation signal MS is maintained at the H level in a period from time t1 to time t6 in which the base drive signal dA is a constant value smaller than the threshold dvth. Thus, at time t2 at which the second time duration T2 in which the modulation signal MS is constant at the H level exceeds the predetermined time duration TU2, the stop time duration measurement signal STP is inverted from the L level to the H level, and at time t3, the stop time duration measurement signal STP is further inverted from the H level to the L level. As a result at time t2, the level switching signal LS transitions from the L level to the H level, and at time t3, the level switching signal LS transitions from the H level to the L level. Thereafter, at time t4 at which the first time duration T1 in which the modulation signal MS is constant at the H level exceeds the predetermined time duration TU2, the stop time duration measurement signal STP is further inverted from the L level to the H level, and at time t5, the stop time duration measurement signal STP is further inverted from the H level to the L level. As a result, at time t4, the level switching signal LS transitions from the L level to the H level, and at time t5, the level switching signal LS transitions from the H level to the L level. That is, in the period from time t2 to time t3 and the period from time t4 to time t5 in which the stop time duration measurement signal STP is at the H level, the level switching signals LS having the H pulse are generated. When the level switching signals LS having the H pulse are not generated, as illustrated by a broken line in FIG. 13, a large undershoot occurs in the drive signal COM, and it takes a time duration to reduce the undershoot. By contrast, the level switching signals LS having the H pulse are generated, and thus, as illustrated by a solid line in FIG. 13, the undershoot occurred in the drive signal COM is reduced, and the time duration until the undershoot is reduced is shortened.

Since other configurations of the liquid ejecting apparatus 1 of the second embodiment are similar to the first embodiment, the description thereof will be omitted.

In the liquid ejecting apparatus 1 of the second embodiment described above, in the drive circuit 50, when the overshoot or undershoot occurs in the drive signal COM, the amplification circuit 550 outputs the first amplified modulation signal AMS1 to reduce the overshoot or the undershoot, but when the overshoot or the undershoot is continued, since the potential of the modulation signal MS is retained, the stop time duration measurement circuit 540 outputs the stop time duration measurement signal STP. The level switching signal generation circuit 710 outputs the second amplified modulation signal AMS2 such that the level shift circuit 750 further reduces the overshoot or the undershoot by switching the potential of the level switching signal LS in response to the base drive signal dA and the stop time duration measurement signal STP.

Specifically, when the overshoot occurs in the drive signal COM, the amplification circuit 550 outputs the first amplified modulation signal AMS1 to reduce the overshoot, but when the overshoot is continued, since the modulation signal MS is retained at the L level, the stop time duration measurement circuit 540 inverts the logic level of the stop time duration measurement signal STP. The level switching signal generation circuit 710 outputs the second amplified modulation signal AMS2 such that the level shift circuit 750 further reduce the overshoot by switching the level switching signal LS from the H level to the L level in accordance with the inversion of the logic level of the stop time duration measurement signal STP.

Moreover, when the undershoot occurs in the drive signal COM, the amplification circuit 550 outputs the first amplified modulation signal AMS1 to reduce the undershoot, but when the undershoot is continued, since the modulation signal MS is retained at the H level, the stop time duration measurement circuit 540 inverts the logic level of the stop time duration measurement signal STP. The level switching signal generation circuit 710 outputs the second amplified modulation signal AMS2 such that the level shift circuit 750 further reduce the overshoot by switching the level switching signal LS from the L level to the H level in accordance with the inversion of the logic level of the stop time duration measurement signal STP.

Accordingly, according to the liquid ejecting apparatus 1 of the second embodiment, since a peak of the overshoot or the undershoot occurred in the drive signal COM output by the drive circuit 50 is lowered, the waveform accuracy of the drive signal COM is improved, and thus, the ejection accuracy of the liquid can be improved.

3. Third Embodiment

Hereinafter, components of a third embodiment similar to the first embodiment or the second embodiment will be given the same reference numerals, the description overlapping with the first embodiment or the second embodiment will be omitted or simplified, and contents different from the first embodiment and the second embodiment will be mainly described.

Since a functional configuration of a drive circuit 50 included in a liquid ejecting apparatus 1 of the third embodiment is similar to FIG. 11, the illustration and description thereof will be omitted. However, although the stop time duration measurement circuit 540 operates constantly in the second embodiment, whereas a stop time duration measurement circuit 540 operates only in a period in which a base drive signal dA has a constant value in the third embodiment.

That is, the stop time duration measurement circuit 540 measures a first time duration T1 in which a modulation signal MS is constant at an L level in a period in which a value of a base drive signal dA is constant, and does not measure the first time duration T1 in a period in which the value of the base drive signal dA changes. Moreover, the stop time duration measurement circuit 540 measures a second time duration T2 in which the modulation signal MS is constant at an H level in the period in which the value of the base drive signal dA is constant, and does not measure the second time duration T2 in the period in which the value of the base drive signal dA changes. Here, the period in which the value of the base drive signal dA is constant includes not only a period in which the drive signal dA is continued at a strictly constant value not to change an internal volume of a cavity 631, but also a period in which the value of the drive signal dA is substantially constant. The period in which the value of the drive signal dA is substantially constant is a period in which the value of the drive signal dA slightly changes to the extent that the internal volume of the cavity 631 is considered not to substantially change among periods excluding a period in which the value of the drive signal dA is changed in order to change a voltage of a drive signal COM to intentionally change the internal volume of the cavity 631.

Figure 14:
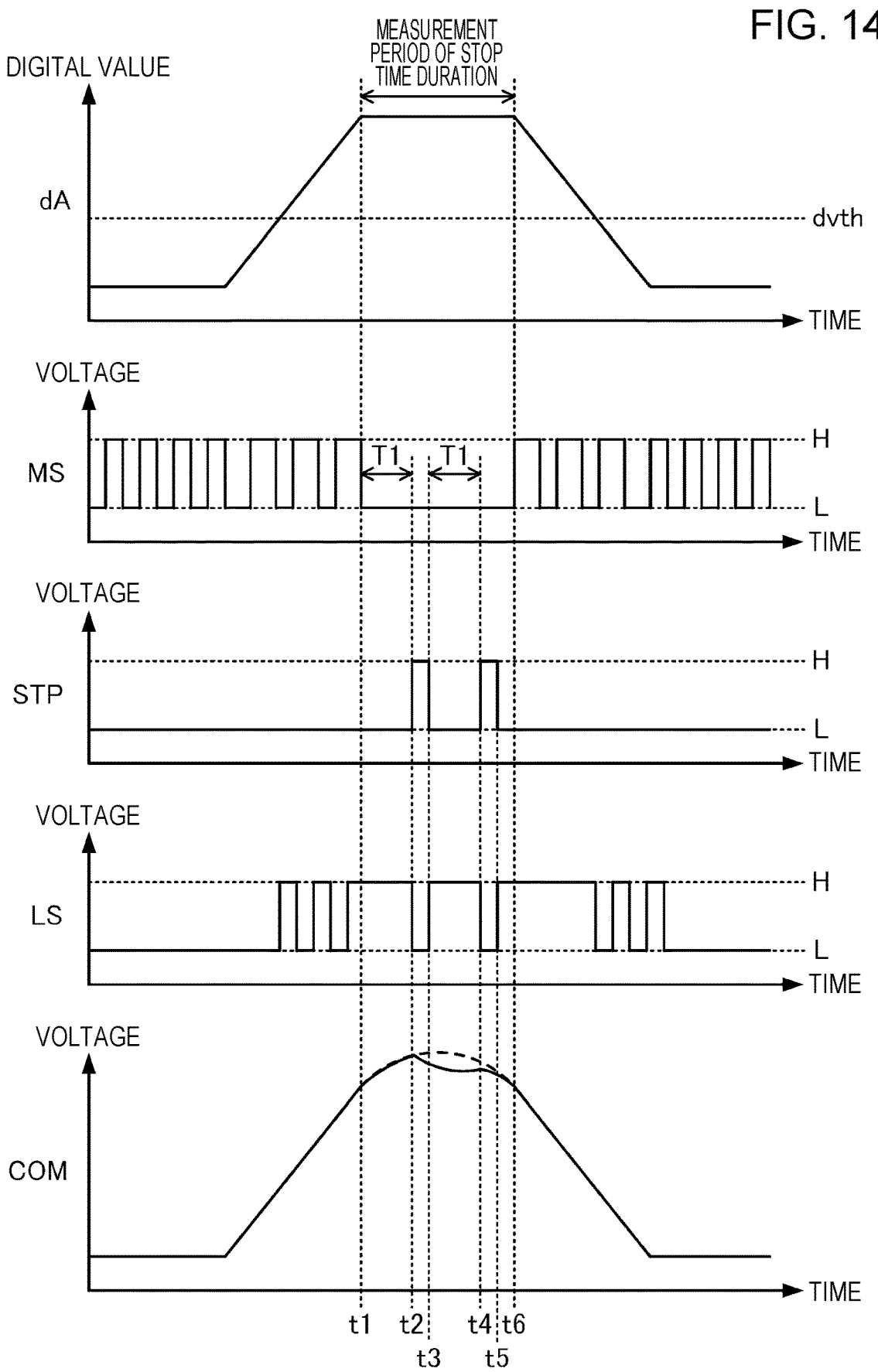
FIG. 14 is a diagram illustrating an example of waveforms of a base drive signal, a modulation signal, a stop time duration measurement signal, a level switching signal, and a drive signal according to a third embodiment.
Figure 15:
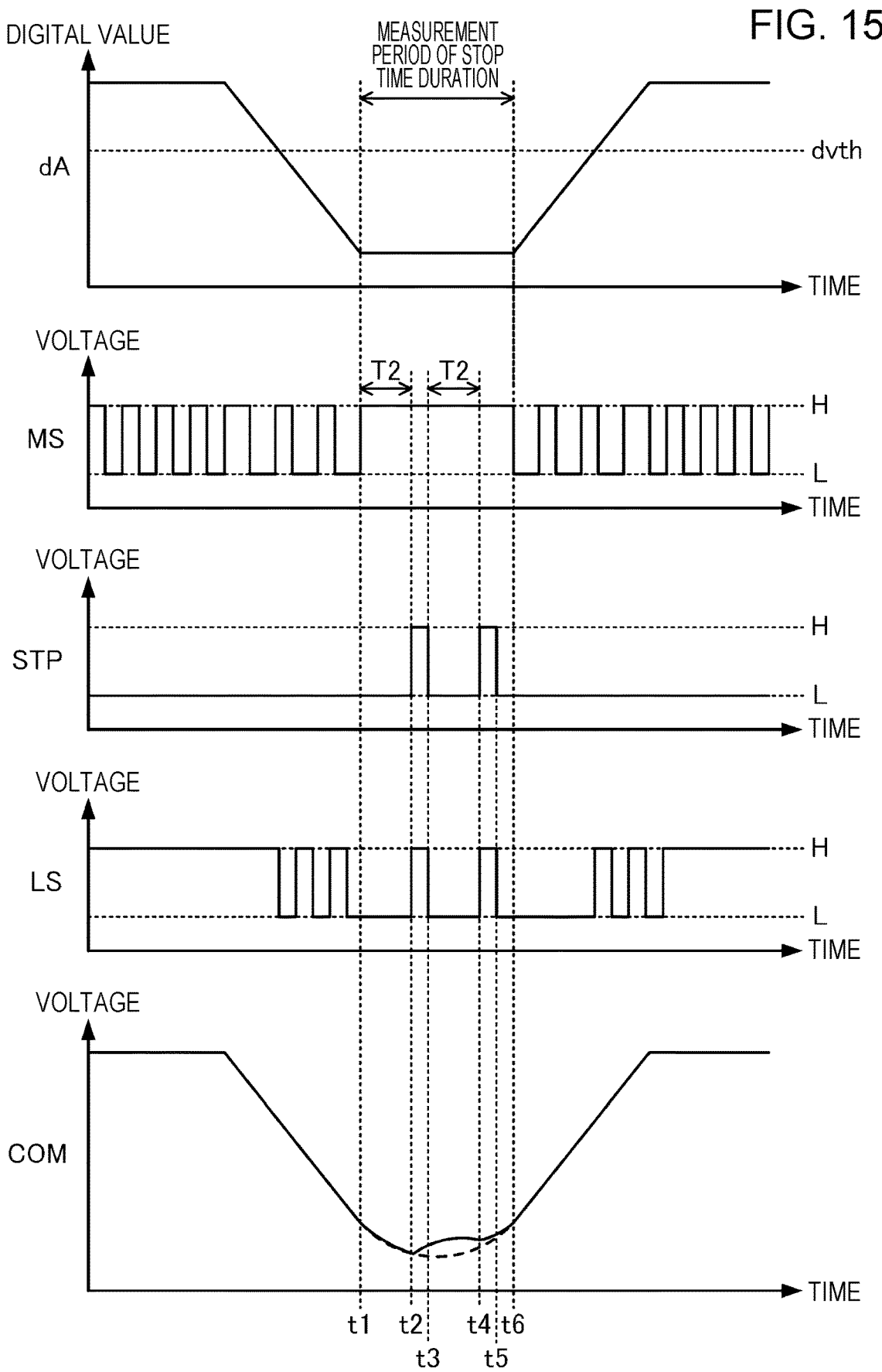
FIG. 15 is a diagram illustrating another example of the waveforms of the base drive signal, the modulation signal, the stop time duration measurement signal, the level switching signal, and the drive signal according to the third embodiment.

FIGS. 14 and 15 illustrate an example of waveforms of the base drive signal dA, the modulation signal MS, a stop time duration measurement signal STP, a level switching signal LS, and the drive signal COM. In addition, in reality, a voltage change of the drive signal COM is delayed with respect to a change in the value of the base drive signal dA. However, in FIGS. 14 and 15, for the sake of convenience in illustration and description, the waveform of the drive signal COM is illustrated as having no delay. In the example of FIG. 14, each signal waveform is the same as FIG. 12, but the stop time duration measurement circuit 540 measures the first time duration T1 in which the modulation signal MS is constant at the L level only in a period in which the base drive signal dA is a constant value higher than a threshold dvth. Moreover, in the example of FIG. 15, each signal waveform is the same as FIG. 13, but the stop time duration measurement circuit 540 measures the second time duration T2 in which the modulation signal MS is constant at the H level only in a period in which the base drive signal dA is a constant value lower than the threshold dvth.

Since other configurations of the liquid ejecting apparatus 1 of the third embodiment are similar to the first embodiment and the second embodiment, the description thereof will be omitted.

According to the liquid ejecting apparatus 1 of the third embodiment described above, effects similar to the liquid ejecting apparatus 1 of the second embodiment can be obtained.

Moreover, in the liquid ejecting apparatus 1 of the third embodiment, in the drive circuit 50, overshoot may occur in the drive signal COM in a certain period in which the value of the base drive signal dA is larger than the threshold dvth, but the overshoot does not occur in the drive signal COM in the period in which the value of the base drive signal dA changes. Accordingly, according to the liquid ejecting apparatus 1 of the third embodiment, in the drive circuit 50, the stop time duration measurement circuit 540 can reduce the overshoot by measuring the first time duration T1 in the period in which the overshoot occurs in the drive signal COM, and can reduce power consumption by not measuring the first time duration T1 in the period in which the overshoot does not occur in the drive signal COM.

Moreover, in the liquid ejecting apparatus 1 of the third embodiment, in the drive circuit 50, undershoot may occur in the drive signal COM in a certain period in which the value of the base drive signal dA is smaller than the threshold dvth, but the undershoot does not occur in the drive signal COM in the period in which the value of the base drive signal dA changes. Accordingly, according to the liquid ejecting apparatus 1 of the third embodiment, in the drive circuit 50, the stop time duration measurement circuit 540 can reduce the undershoot by measuring the second time duration T2 in the period in which the undershoot occurs in the drive signal COM, and can reduce power consumption by not measuring the second time duration T2 in the period in which the undershoot does not occur in the drive signal COM.

4. Fourth Embodiment

Hereinafter, components of a fourth embodiment similar to any of the first embodiment to the third embodiment will be given the same reference numerals, the description overlapping with any of the first embodiment to the third embodiment will be omitted and simplified, and contents different from any of the first embodiment to the third embodiment will be mainly described.

In general, the number of ejecting sections 600 to be driven changes depending on the image formed at the medium P, and an electrostatic capacitance to become a load changes. In order to precisely control a weight of an ink droplet, it is necessary to precisely control the waveform of the drive signal COM. However, when the level switching signal generation circuit 710 generates the level switching signal LS based on the base drive signal dA, even though the electrostatic capacitance to become the load changes, the waveform of the level switching signal LS does not change. As a result, there is a possibility that the waveform accuracy of the drive signal COM deteriorates, such as the overshoot or undershoot occurs in the drive signal COM. Therefore, in the drive circuit 50 according to the fourth embodiment, the level switching signal generation circuit 710 generates the level switching signal LS by using the signal obtained by feeding back the voltage of the drive signal COM together with the base drive signal dA.

Figure 16:
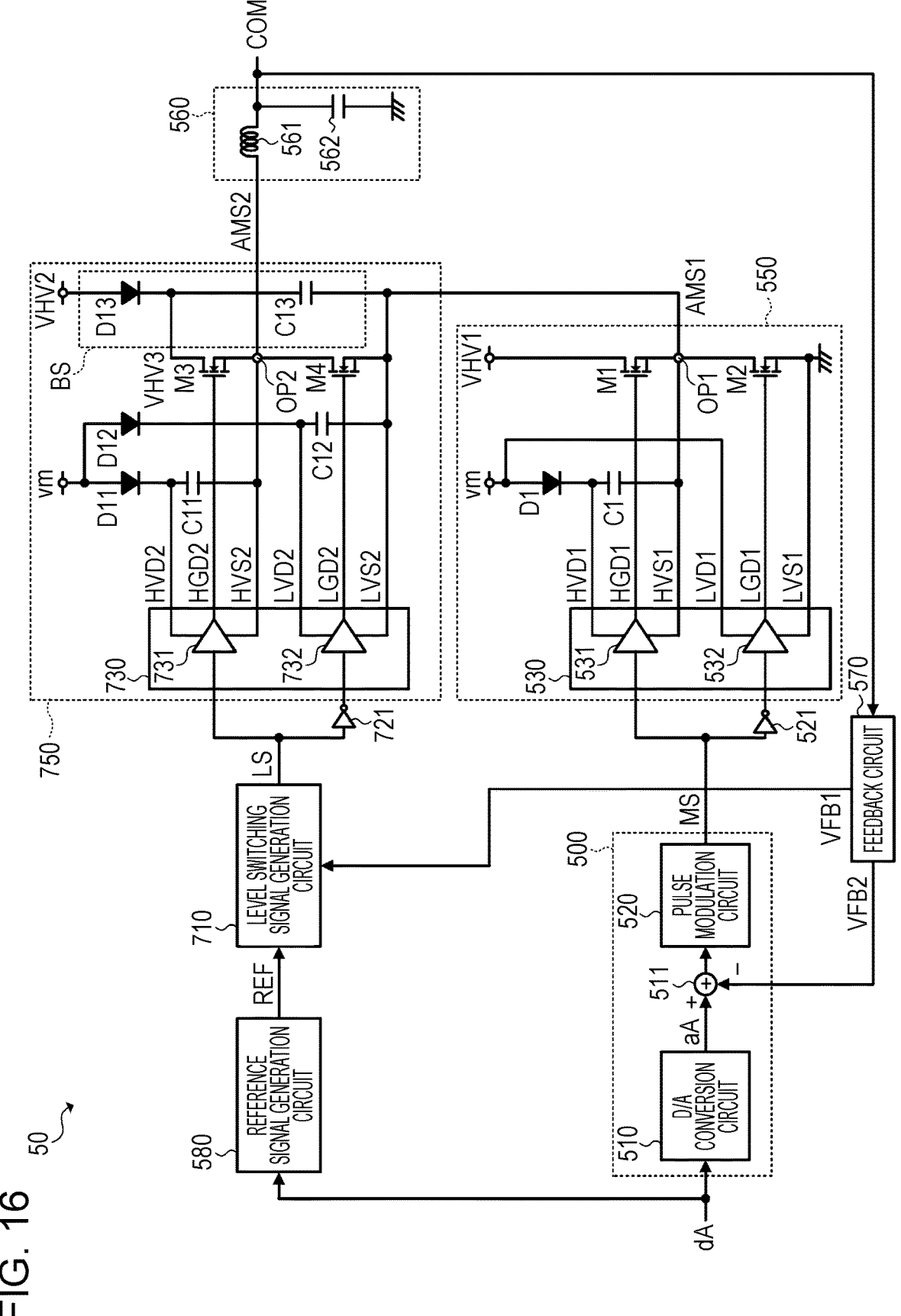
FIG. 16 is a diagram illustrating an example of a functional configuration of a drive circuit according to a fourth embodiment.

FIG. 16 is a diagram illustrating an example of a functional configuration of the drive circuit 50 of the liquid ejecting apparatus 1 of the fourth embodiment. As illustrated in FIG. 16, as in the first embodiment, the drive circuit 50 according to the fourth embodiment includes a D/A conversion circuit 510, an adder 511, a pulse modulation circuit 520, an inverter 521, an amplification circuit 550, a demodulation circuit 560, a feedback circuit 570, a level switching signal generation circuit 710, and a level shift circuit 750. The drive circuit 50 according to the fourth embodiment further includes a reference signal generation circuit 580. Since configurations and functions of the D/A conversion circuit 510, the adder 511, the pulse modulation circuit 520, the inverter 521, the amplification circuit 550, and the demodulation circuit 560 are similar to the first embodiment to the third embodiment, the description thereof will be omitted.

Figures 17, 18:
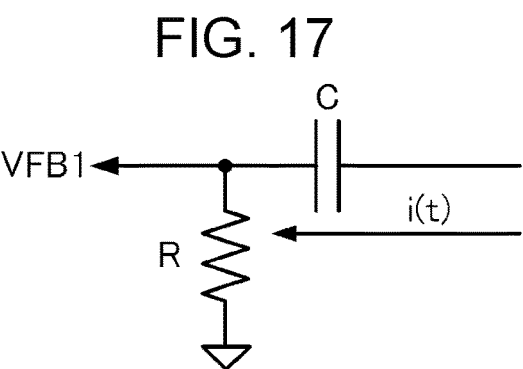
FIG. 17 is a diagram illustrating an example of a configuration of a high-pass filter.
FIG. 18 is a diagram illustrating an example of waveforms of a base drive signal and a reference signal according to the fourth embodiment.

In the fourth embodiment, the feedback circuit 570 outputs a first feedback signal VFB1 to the level switching signal generation circuit 710 in response to the drive signal COM generated by the demodulation circuit 560. For example, the first feedback signal VFB1 may be a signal obtained by dividing the drive signal COM. The feedback circuit 570 may include a high-pass filter, and outputs the first feedback signal VFB1 obtained by extracting high frequency components of the drive signal COM by the high-pass filter. As illustrated in FIG. 17, for example, the high-pass filter includes a capacitor and a resistor.

Moreover, the feedback circuit 570 outputs a second feedback signal VFB2 to the modulation circuit 500 in response to the drive signal COM generated by the demodulation circuit 560. Specifically, the feedback circuit 570 supplies the second feedback signal VFB2 obtained by dividing the drive signal COM to the adder 511. Moreover, the feedback circuit 570 may include a high-pass filter and output the second feedback signal VFB2 including signals obtained by dividing the drive signal COM and signals obtained by extracting the high frequency components of the drive signal COM by the high-pass filter. A high-pass filter for generating the second feedback signal VFB2 and a high-pass filter for generating the first feedback signal VFB1 may be common. The modulation circuit 500 outputs the modulation signal MS based on the second feedback signal VFB2. As a result, the waveform accuracy of the drive signal COM output by the drive circuit 50 is improved.

In the high-pass filter illustrated in FIG. 17, when a capacitor value of the capacitor is C, a value of the resistor is R, and a current flowing through the capacitor and the resistor is i (t), in a state where a voltage vfb1 of the first feedback signal VFB1 is obtained by Equation (1), a proportional relationship is established between the drive signal COM and the base drive signal aA. In Equation (1), a is a constant, and V(t) is a voltage of the base drive signal aA.

$$V_{fb}1 = i(t) \cdot R = \alpha RC \frac{V(t)}{dt} \left( 1 - e^{\frac{1}{RC}t} \right) \tag{1}$$

When a product RC of the resistor value R and the capacitor value C is sufficiently smaller than a time duration tx in which a voltage V(t) changes, the voltage Vfb in Equation (1) can be regarded as a rectangular wave. For example, when the time duration tx is about 1 μs, RC is desirably $100 \times 10^{-9}$ or less. The voltage Vb of this rectangular wave is represented by Equation (2). In Equation (2), Va is a change amount of the voltage of the base drive signal aA in the time duration tx. The change amount Va of the voltage of the base drive signal aA in the time duration tx corresponds to a change amount Da of the digital value in the time duration tx of the base drive signal dA.

$$Vb = \alpha RC \frac{Va}{tx} \tag{2}$$

The reference signal generation circuit 580 generates a reference signal REF corresponding to the base drive signal dA. In the present embodiment, the reference signal REF is a signal having a voltage corresponding to a temporal change amount of the base drive signal dA, and the reference signal REF is a rectangular wave of the voltage Vb in the time duration tx in which the digital value of the base drive signal dA changes. From Equation (2), the voltage Vb is proportional to a slope of the voltage change of the base drive signal aA. FIG. 18 illustrates an example of waveforms of the base drive signal dA, the base drive signal aA, and the reference signal REF.

For example, the reference signal generation circuit 580 may receive, as an input, the base drive signal dA and may generate the reference signal REF based on the base drive signal dA. For example, the reference signal generation circuit 580 may calculate a difference from a previous value of the base drive signal dA whenever the value of the base drive signal dA is updated, and may generate he reference signal REF having a voltage proportional to the difference. Alternatively, the reference signal generation circuit 580 may include a storage in which information on the base drive signal dA is stored, and may generate the reference signal REF based on the information stored in the storage. For example, the information on the base drive signal dA stored in the storage may be information including a period in which the value of the base drive signal dA changes and a change amount of the value of the base drive signal dA in the period. The reference signal generation circuit 580 may set the period in which the value of the base drive signal dA changes to a period of the rectangular wave of the reference signal REF, and may calculate the voltage of the rectangular wave of the reference signal REF by multiplying the change amount of the value of the base drive signal dA in the period by a coefficient.

The level switching signal generation circuit 710 receives, as an input, the reference signal REF generated by the reference signal generation circuit 580, generates the level switching signal LS based on the reference signal REF, and outputs the level switching signal LS to the gate drive circuit 730. The level switching signal LS is a digital signal including a potential having an L level and a potential having an H level higher than the L level. Specifically, the level switching signal generation circuit 710 further receives, as an input, the first feedback signal VFB1 output by the feedback circuit 570, and switches the potential of the level switching signal LS in response to the reference signal REF and the first feedback signal VFB1. Specifically, the level switching signal generation circuit 710 compares the voltage of the reference signal REF with the voltage of the first feedback signal VFB1, and outputs the level switching signal LS having the H level when the voltage of the reference signal REF is higher than the voltage of the first feedback signal VFB1, and outputs the level switching signal LS having the L level when the voltage of the reference signal REF is lower than the voltage of the first feedback signal VFB1. As described above, since the level switching signal generation circuit 710 generates the level switching signal LS such that the voltage of the first feedback signal VFB1 follows the voltage of the reference signal REF, the influence of the change in the load capacitance of the drive signal COM is reduced, and the waveform accuracy of the drive signal COM can be improved.

Figure 19:
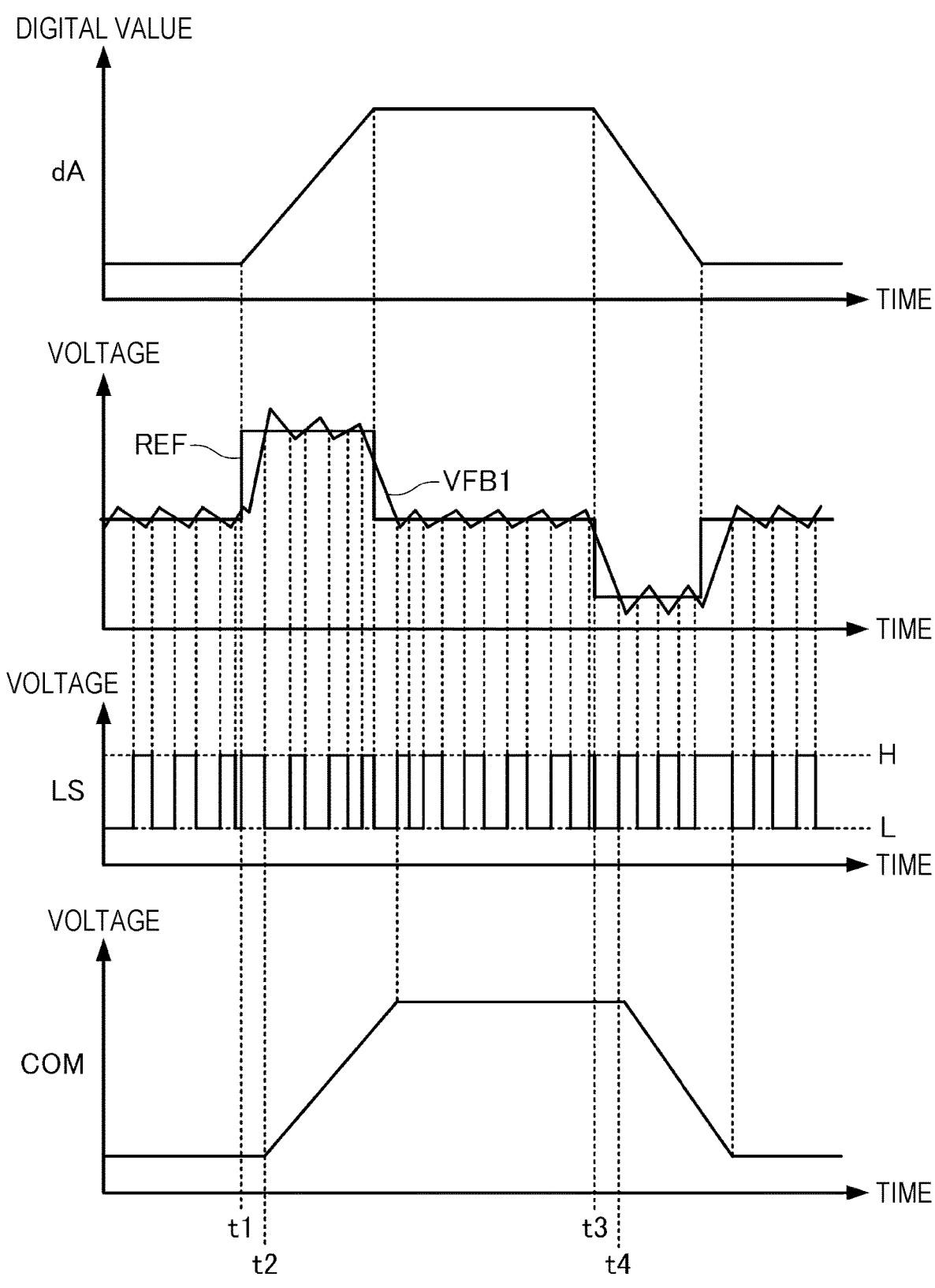
FIG. 19 is a diagram illustrating an example of the waveforms of the base drive signal, the reference signal, a first feedback signal, a level switching signal, and a drive signal according to the fourth embodiment.

FIG. 19 illustrates an example of waveforms of the base drive signal dA, the reference signal REF, the first feedback signal VFB1, the level switching signal LS, and the drive signal COM. As illustrated in FIG. 19, the reference signal REF corresponds to a waveform obtained by differentiating the waveform of the base drive signal dA, and the voltage of the reference signal REF corresponds to the temporal change amount of the base drive signal dA. The first feedback signal VFB1 corresponds to the high frequency component of the drive signal COM. When the voltage of the reference signal REF is higher than the voltage of the first feedback signal VFB1, the level switching signal LS becomes the H level, and when the voltage of the reference signal REF is lower than the voltage of the first feedback signal VFB1, the level switching signal LS becomes the L level.

As a result, in a period from time t1 at which the value of the base drive signal dA starts increasing to time t2 at which the voltage of the first feedback signal VFB1 becomes higher than the voltage of the reference signal REF, since the level switching signal LS becomes the H level, the transistor M3 is energized. As the load capacitance of the drive signal COM increases, the period from time t1 to time t2 becomes longer. Thus, a time duration in which the transistor M3 is energized becomes longer, and the current supplied to the load capacitance increases.

On the other hand, in a period from time t3 at which the value of the base drive signal dA starts decreasing to time t4 at which the voltage of the first feedback signal VFB1 is lower than the voltage of the reference signal REF, since the level switching signal LS becomes the L level, the transistor M3 is unenergized. As the load capacitance of the drive signal COM increases, the period from time t3 to time t4 becomes longer. Thus, a time duration in which the transistor M3 is unenergized becomes longer, and the current released from the load capacitance increases.

That is, simultaneously when the change in the value of the base drive signal dA starts, since a period in which the transistor M3 is energized or a period in which the transistor M3 is unenergized is appropriately adjusted in accordance with the magnitude of the load capacitance, the waveform accuracy of the drive signal COM can be improved.

In particular, in the feedback circuit 570, since a phase of the first feedback signal VFB1 output from the high-pass filter is advanced with respect to the drive signal COM, the first feedback signal VFB1 is used, and thus, transitional responsiveness of the level switching signal generation circuit 710 with respect to the change in the potential of the drive signal COM is improved. As a result, the overshoot or undershoot in the waveform of the drive signal COM is reduced.

Since other configurations of the liquid ejecting apparatus 1 of the fourth embodiment are similar to the first embodiment to the third embodiment, the description thereof will be omitted.

In addition, the ejecting section 600 including the piezoelectric element 60 is an example of a "drive section". Moreover, the potential having the L level of the level switching signal LS is an example of a "first potential", and the potential having the H level of the level switching signal LS is an example of a "second potential".

In the liquid ejecting apparatus 1 of the fourth embodiment described above, in the drive circuit 50, the modulation circuit 500 outputs the modulation signal MS based on the second feedback signal VFB2 corresponding to the drive signal COM, and the amplification circuit 550 outputs the first amplified modulation signal AMS1 obtained by amplifying the modulation signal MS. Thus, the amplification circuit 550 can output an appropriate first amplified modulation signal AMS1 by following the second feedback signal VFB2 that changes in accordance with the magnitude of the load capacitance. Moreover, the reference signal generation circuit 580 generates the reference signal REF corresponding to the base drive signal dA, the level switching signal generation circuit 710 switches the potential of the level switching signal LS in response to the reference signal REF and the first feedback signal VFB1 corresponding to the drive signal COM, and the level shift circuit 750 outputs, as the second amplified modulation signal AMS2, the first amplified modulation signal AMS1 or the signal obtained by shifting the potential of the first amplified modulation signal AMS1 in accordance with the potential of the level switching signal LS. That is, since the level switching signal LS such that the voltage of the first feedback signal VFB1 that changes in accordance with the magnitude of the load capacitance follows the voltage of the reference signal REF, the level shift circuit 750 can output an appropriate second amplified modulation signal AMS2 corresponding to the magnitude of the load capacitance. Accordingly, according to the liquid ejecting apparatus 1 of the fourth embodiment, since the influence on the drive signal COM due to the change in the load capacitance is reduced, the waveform accuracy of the drive signal COM is improved, and thus, the ejection accuracy of the liquid can be improved.

Moreover, in the liquid ejecting apparatus 1 of the fourth embodiment, in the drive circuit 50, since the feedback circuit 570 outputs the first feedback signal VFB1 of which the phase is advanced by the high-pass filter, the transitional responsiveness of the level switching signal generation circuit 710 with respect to the change in the potential of the drive signal COM is improved, and the level shift circuit 750 can output an appropriate second amplified modulation signal AMS2 corresponding to the magnitude of the load capacitance. Accordingly, according to the liquid ejecting apparatus 1 of the fourth embodiment, since the overshoot or the undershoot in the waveform of the drive signal COM is reduced, the waveform accuracy of the drive signal COM is improved, and thus, the ejection accuracy of the liquid can be improved.

5. Fifth Embodiment

Hereinafter, components of a fifth embodiment similar to any of the first embodiment to the fourth embodiment will be given the same reference numerals, the description overlapping with any of the first embodiment to the fourth embodiment will be omitted and simplified, and contents different from any of the first embodiment to the fourth embodiment will be mainly described.

Since a functional configuration of a drive circuit 50 included in a liquid ejecting apparatus 1 of the fifth embodiment is similar to the drive circuit 50 according to the fourth embodiment illustrated in FIG. 16, the illustration thereof will be omitted. However, in the fifth embodiment, in the drive circuit 50, an operation of a level switching signal generation circuit 710 is different from the fourth embodiment.

In the fifth embodiment, as in the fourth embodiment, the level switching signal generation circuit 710 switches a potential of a level switching signal LS in response to a reference signal REF generated by a reference signal generation circuit 580 and a first feedback signal VFB1 output by a feedback circuit 570 in a period in which a value of the base drive signal dA changes. Specifically, the level switching signal generation circuit 710 compares a voltage of the reference signal REF with a voltage of the first feedback signal VFB1 in the period in which the value of the base drive signal dA changes, outputs a level switching signal LS having an H level when the voltage of the reference signal REF is higher than the voltage of the first feedback signal VFB1, and outputs a level switching signal LS having an L level when the voltage of the reference signal REF is lower than the voltage of the first feedback signal VFB1.

Moreover, the level switching signal generation circuit 710 retains the potential of the level switching signal LS in a period in which the value of the base drive signal dA is constant. Specifically, the level switching signal generation circuit 710 retains the level switching signal LS at the H level for a period in which the base drive signal dA is constant at a value higher than a threshold dvth1. Moreover, the level switching signal generation circuit 710 retains the level switching signal LS at the L level for a period in which the base drive signal dA is constant at a value lower than the threshold dvth1. For example, the threshold dvth1 may be a value dvhv1 of the base drive signal dA corresponding to a voltage vhv1 of a voltage signal VHV1 supplied to a drain terminal of a transistor M1.

Figure 20:
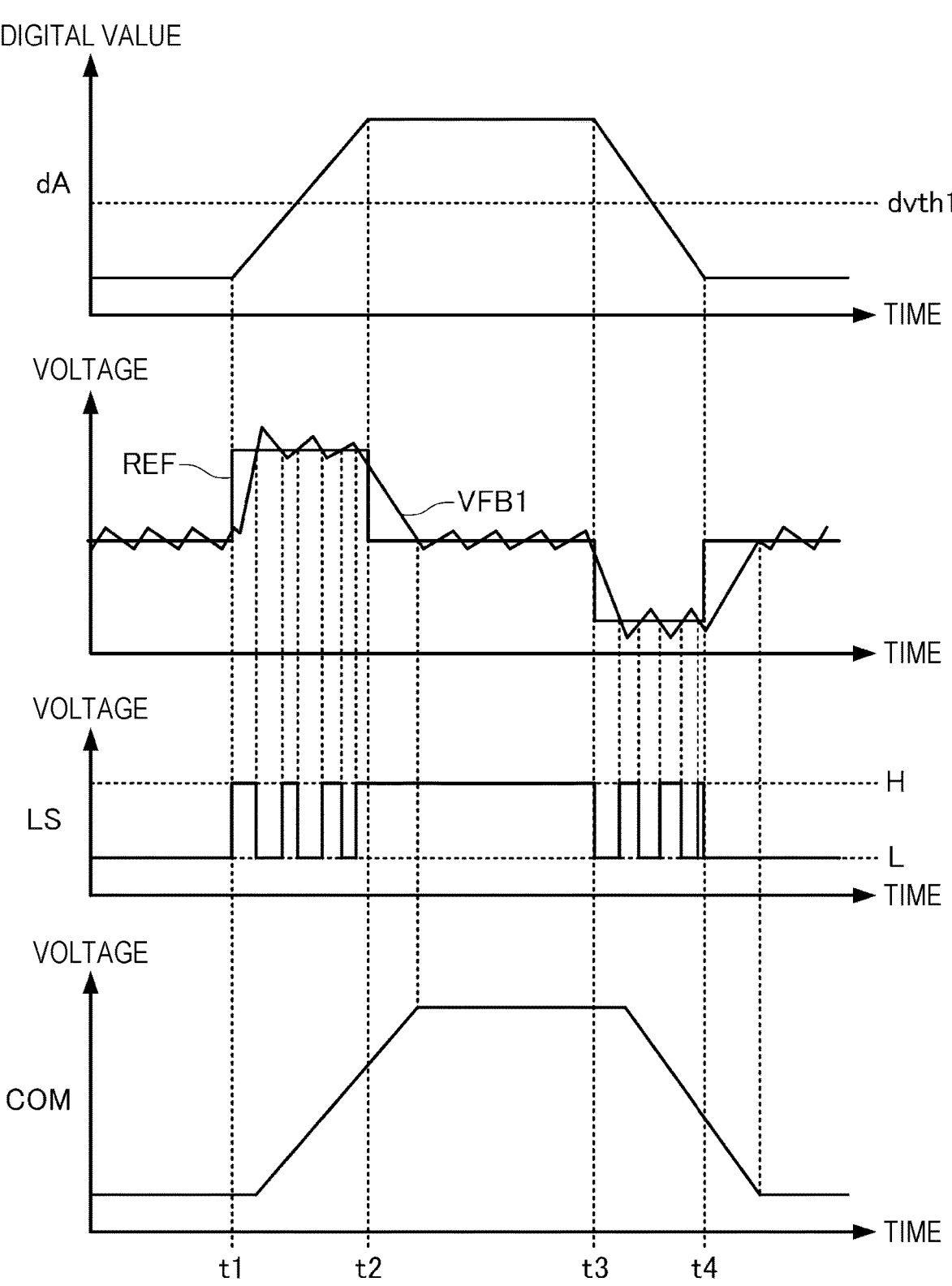
FIG. 20 is a diagram illustrating an example of waveforms of a base drive signal, a reference signal, a first feedback signal, a level switching signal, and a drive signal according to a fifth embodiment.

FIG. 20 illustrates an example of waveforms of the base drive signal dA, the reference signal REF, the first feedback signal VFB1, the level switching signal LS, and the drive signal COM. In FIG. 20, each of the waveforms of the base drive signal dA and the reference signal REF is the same as FIG. 19.

In the example of FIG. 20, the level switching signal LS retains the L level in a period before time t1 at which the base drive signal dA is constant at a value lower than the threshold dvth1. Moreover, in a period from time t1 to time t2 in which the value of the base drive signal dA increases, when the voltage of the first feedback signal VFB1 is higher than the voltage of the reference signal REF, the level switching signal LS becomes the L level, and when the voltage of the first feedback signal VFB1 is lower than the voltage of the reference signal REF, the level switching signal LS becomes the H level. Moreover, the level switching signal LS retains the H level in a period from time t2 to time t3 in which the base drive signal dA is constant at a value higher than the threshold dvth1. Moreover, in a period from time t3 to time t4 in which the value of the base drive signal dA decreases, when the voltage of the first feedback signal VFB1 is higher than the voltage of the reference signal REF, the level switching signal LS becomes the L level, and when the voltage of the first feedback signal VFB1 is lower than the voltage of the reference signal REF, the level switching signal LS becomes the H level. Moreover, the level switching signal LS retains the L level in a period after time t4 in which the base drive signal dA is constant at a value lower than the threshold dvth1.

Since other configurations of the liquid ejecting apparatus 1 of the fifth embodiment are similar to the first embodiment to the fourth embodiment, the description thereof will be omitted.

According to the liquid ejecting apparatus 1 of the fifth embodiment described above, effects similar to the liquid ejecting apparatus 1 of the fourth embodiment can be obtained.

Moreover, in the liquid ejecting apparatus 1 of the fifth embodiment, in the drive circuit 50, the level switching signal generation circuit 710 retains the potential of the level switching signal LS in the period in which the value of the base drive signal dA is constant. Accordingly, according to the liquid ejecting apparatus 1 of the fifth embodiment, since transistors M1 and M2 of a level shift circuit 750 do not perform switching operations in the period in which the potential of the drive signal COM is constant, waveform accuracy of the drive signal COM is improved, and ejection accuracy of a liquid can be improved.

6. Sixth Embodiment

Hereinafter, components of a sixth embodiment similar to any of the first embodiment to the fifth embodiment will be given the same reference numerals, the description overlapping with any of the first embodiment to the fifth embodiment will be omitted and simplified, and contents different from any of the first embodiment to the fifth embodiment will be mainly described.

Since a functional configuration of a drive circuit 50 included in a liquid ejecting apparatus 1 of the sixth embodiment is similar to the drive circuit 50 according to the fourth embodiment illustrated in FIG. 16, the illustration thereof will be omitted. However, in the sixth embodiment, in the drive circuit 50, an operation of a level switching signal generation circuit 710 is different from the fourth embodiment.

In the sixth embodiment, as in the fourth embodiment or the fifth embodiment, the level switching signal generation circuit 710 switches a potential of a level switching signal LS in response to a reference signal REF generated by a reference signal generation circuit 580 and a first feedback signal VFB1 output by a feedback circuit 570 in a period in which a value of the base drive signal dA changes. Specifically, the level switching signal generation circuit 710 compares a voltage of the reference signal REF with a voltage of the first feedback signal VFB1 in the period in which the value of the base drive signal dA changes, outputs a level switching signal LS having an H level when the voltage of the reference signal REF is higher than the voltage of the first feedback signal VFB1, and outputs a level switching signal LS having an L level when the voltage of the reference signal REF is lower than the voltage of the first feedback signal VFB1.

Moreover, the level switching signal generation circuit 710 does not retain the potential of the level switching signal LS in a period P1 in which the value of the base drive signal dA is constant, and retains the potential of the level switching signal LS in a period P2 in which the value of the base drive signal dA is constant subsequently to the period P1. Specifically, the level switching signal generation circuit 710 switches the potential of the level switching signal LS in response to the reference signal REF generated by the reference signal generation circuit 580 and the first feedback signal VFB1 output by the feedback circuit 570 in the period P1, and retains the potential of the level switching signal LS in the period P2. Specifically, the level switching signal generation circuit 710 does not retain the level switching signal LS at the H level in the period P1 in the base drive signal dA is constant at a value higher than the threshold dvth1, and switches the level switching signal LS to the H level or the L level in response to the reference signal REF and the first feedback signal VFB1. Moreover, the level switching signal generation circuit 710 retains the level switching signal LS at the H level or the L level in the period P2. For example, the threshold dvth1 may be a value dvhv1 of the base drive signal dA corresponding to a voltage vhv1 of a voltage signal VHV1 supplied to a drain terminal of a transistor M1.

Figure 21:
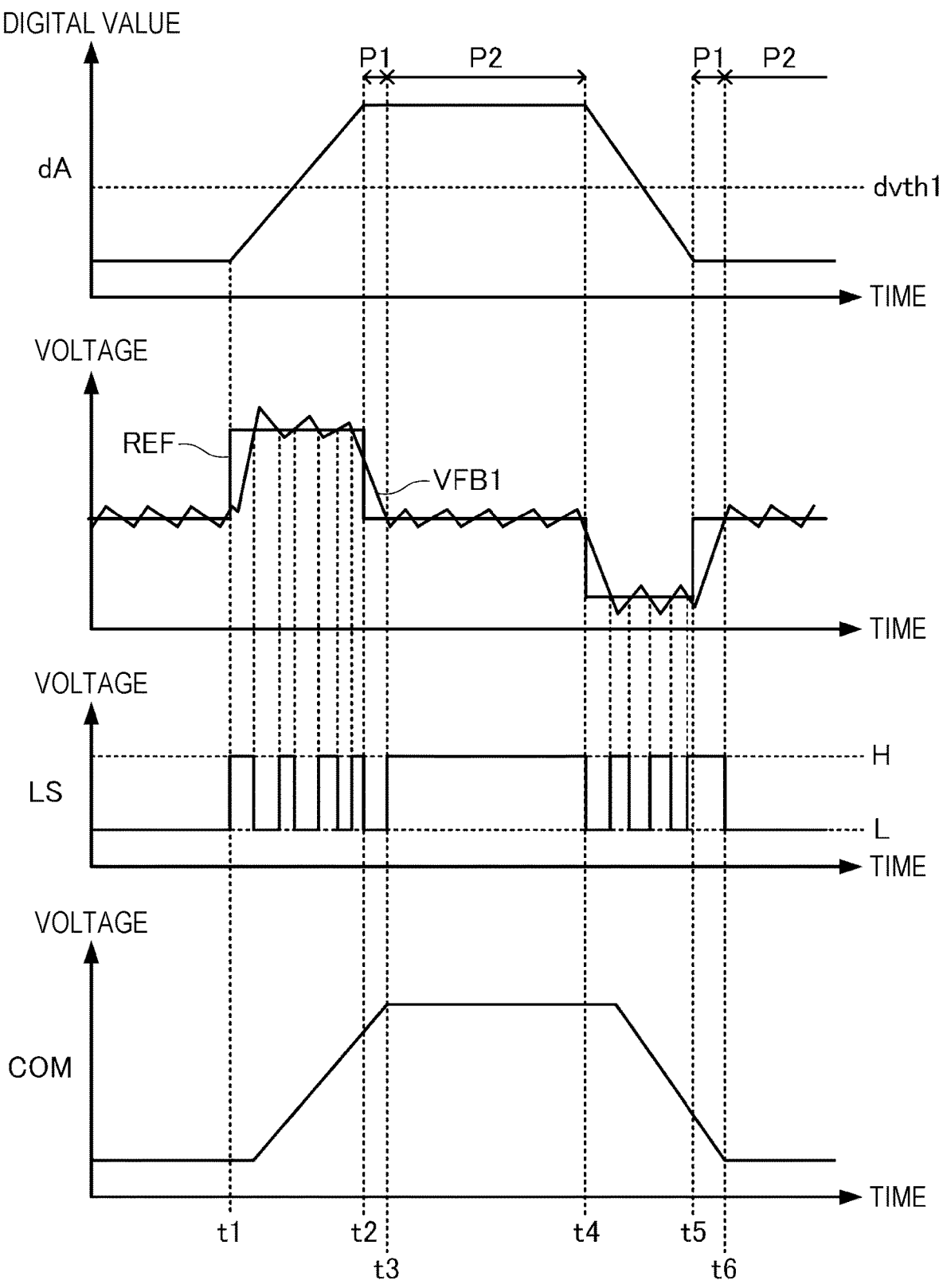
FIG. 21 is a diagram illustrating an example of waveforms of a base drive signal, a reference signal, a first feedback signal, a level switching signal, and a drive signal according to a sixth embodiment.

FIG. 21 illustrates an example of waveforms of the base drive signal dA, the reference signal REF, the first feedback signal VFB1, the level switching signal LS, and the drive signal COM. In FIG. 21, each of the waveforms of the base drive signal dA and the reference signal REF is the same as FIGS. 19 and 20.

In the example of FIG. 21, the level switching signal LS retains the L level in a period before time t1 at which the base drive signal dA is constant at a value lower than the threshold dvth1. Moreover, in a period from time t1 to time t2 in which the value of the base drive signal dA increases, when the voltage of the first feedback signal VFB1 is higher than the voltage of the reference signal REF, the level switching signal LS becomes the L level, and when the voltage of the first feedback signal VFB1 is lower than the voltage of the reference signal REF, the level switching signal LS becomes the H level.

Moreover, in the period P1 from time t2 to time t3 among periods from time t2 to time t4 in which the base drive signal dA is constant at a value higher than the threshold dvth1, the level switching signal LS is not retained at the H level. When the voltage of the first feedback signal VFB1 is higher than the voltage of the reference signal REF, the level switching signal LS becomes the L level, and when the voltage of the first feedback signal VFB1 is lower than the voltage of the reference signal REF, the level switching signal LS becomes the H level. Moreover, in the period P2 from time t3 to time t4 among the periods from time t2 to time t4 in which the base drive signal dA is constant at a value higher than the threshold dvth1, the level switching signal LS is retained at the H level. In the example of FIG. 21, a boundary between the period P1 and the period P2 is time t3 at which the voltage of the first feedback signal VFB1 decreases and coincides with the voltage of the reference signal REF, but may be before time t3 or may be after time t3.

Moreover, in the period from time t4 to time t5 in which the value of the base drive signal dA decreases, when the voltage of the first feedback signal VFB1 is higher than the voltage of the reference signal REF, the level switching signal LS becomes the L level, and when the voltage of the first feedback signal VFB1 is lower than the voltage of the reference signal REF, the level switching signal LS becomes the H level.

Moreover, in the period P1 from time t5 to time t6 among periods after time t5 in which the base drive signal dA is constant at a value lower than the threshold dvth1, the level switching signal LS is not retained at the L level. When the voltage of the first feedback signal VFB1 is higher than the voltage of the reference signal REF, the level switching signal LS becomes the L level, and when the voltage of the first feedback signal VFB1 is lower than the voltage of the reference signal REF, the level switching signal LS becomes the H level. Moreover, the level switching signal LS is retained at the L level in the period P2 after time t6 among the periods after time t5 in which the base drive signal dA is constant at a value lower than the threshold dvth1. In the example of FIG. 21, the boundary between the period P1 and the period P2 is time t6 at which the voltage of the first feedback signal VFB1 rises and coincides with the voltage of the reference signal REF, but may before time t6 or may be after time t6.

Here, when the level switching signal LS is retained at the H level in the period P1 from time t2 to time t3 as in the example of FIG. 20, the transistors M2 and M3 are energized, and the transistors M1 and M4 are unenergized. Thus, since the voltage of the second output point OP2 becomes a voltage vhv2 of a voltage signal VHV2, a current i flowing from the second output point OP2 toward a load capacitance is represented by Equation (3). In Equation (3), vcom is a voltage of the drive signal COM, and L is an inductance value of an inductor 561.

$$\frac{di}{dt} = \frac{vhv2 - vcom}{L} \tag{3}$$

By contrast, in the present embodiment, in the period P1 from time t2 to time t3, the level switching signal LS is not retained at the H level, and since the voltage of the first feedback signal VFB1 is higher than the voltage of the reference signal REF as illustrated in FIG. 21, the level switching signal LS becomes the L level. Thus, since the transistors M2 and M4 are energized, the transistors M1 and M3 are unenergized, and the voltage of the second output point OP2 becomes 0 V, the current i flowing from a first output point OP1 toward the load capacitance is represented by Equation (4).

$$\frac{di}{dt} = -\frac{vcom}{L} \tag{4}$$

The current i decreases according to Equation (3) or Equation (4), but the decrease in the current i in Equation (4) is steeper than in Equation (3). That is, the level switching signal generation circuit 710 does not retain the level switching signal LS at the H level in the period P1 from time t2 to time t3, and thus, a time duration until the current i supplied to a capacitive load reaches 0 is shortened. Accordingly, the overshoot occurred in the drive signal COM is reduced. Similarly, the level switching signal generation circuit 710 does not retain the level switching signal LS at the L level in the period P1 from time t5 to time t6, and thus, a time duration until the current i released from the capacitive load reaches 0 is shortened. Accordingly, the undershoot occurred in the drive signal COM is reduced.

Since other configurations of the liquid ejecting apparatus 1 of the sixth embodiment are similar to the first embodiment to the fifth embodiment, the description thereof will be omitted.

In addition, the period P1 is an example of a "first period", and the period P2 is an example of a "second period".

According to the liquid ejecting apparatus 1 of the sixth embodiment described above, effects similar to the liquid ejecting apparatus 1 of the fourth embodiment or the fifth embodiment can be obtained.

Moreover, according to the liquid ejecting apparatus 1 of the sixth embodiment, the level switching signal generation circuit 710 does not retain the potential of the level switching signal LS in the period P1 in which the value of the base drive signal dA is constant, and switches the potential of the level switching signal LS in response to the reference signal REF and the first feedback signal VFB1. As a result, the overshoot or the undershoot occurred in the drive signal COM can be reduced. Further, according to the liquid ejecting apparatus 1 of the sixth embodiment, the level switching signal generation circuit 710 retains the potential of the level switching signal LS in the period P2 in which the value of the base drive signal dA is constant subsequently to the period P1. As a result, since the transistors M1 and M2 of the level shift circuit 750 do not perform a switching operation in the period in which the potential of the drive signal COM is constant, the waveform accuracy of the drive signal COM can be improved, and the ejection accuracy of the liquid can be improved.

In addition, as a change rate of the value of the base drive signal dA increases, an absolute value of a voltage Vb of a rectangular wave of the reference signal REF increases, and thus, the time duration until the current i reaches 0 is lengthened. On the contrary, as the change rate of the value of the base drive signal dA decreases, the absolute value of the voltage Vb of the rectangular wave of the reference signal REF decreases, and thus, the time duration until the current i reaches 0 is shortened. Thus, the level switching signal generation circuit 710 may change a length of the period P1 in accordance with the change rate of the value of the base drive signal dA. Specifically, the level switching signal generation circuit 710 sets the period P1 to a first time length when the change rate of the value of the base drive signal dA is a first value, and sets the period P1 to a second time length longer than the first time length when the change rate of the value of the base drive signal dA is a second value larger than the first value.

Moreover, as the load capacitance of the drive signal COM increases, since a charge amount supplied to the load capacitance and a charge amount released from the load capacitance increase, the time duration until the current i reaches 0 is lengthened. On the contrary, as the load capacitance of the drive signal COM decreases, since the charge amount supplied to the load capacitance and the charge amount released from the load capacitance decrease, the time duration until the current i reaches 0 is shortened. Thus, the level switching signal generation circuit 710 may change the length of the period P1 in accordance with the magnitude of the load capacitance of the drive signal COM. Specifically, the level switching signal generation circuit 710 sets the period P1 to a first time length when the load capacitance is a first value, and sets the period P1 to a second time length longer than the first time length when the load capacitance is a second value larger than the first value. In addition, the magnitude of the load capacitance increases or decreases according to the number of piezoelectric elements 60 driven by the drive circuit 50 for each printing cycle T. A drive data signal DATA generated by the controller 100 based on image data supplied from a host computer or the like includes information that can specify the number of piezoelectric elements 60 driven by the drive circuit 50 for each printing cycle T. Accordingly, for example, the level switching signal generation circuit 710 may calculate the magnitude of the load capacitance based on the drive data signal DATA.

As described above, the level switching signal generation circuit 710 changes the length of the period P1 in accordance with the change rate of the value of the base drive signal dA or the magnitude of the load capacitance, and thus, the time duration until the current i reaches 0 is shortened. Accordingly, the overshoot or the undershoot occurred in the drive signal COM is reduced.

7. Modification Examples

The present disclosure is not limited to the present embodiment, and various modifications can be made within the scope of the spirit of the present disclosure.

For example, in each of the above embodiments, although the base drive signal dA is input from the controller 100 to the drive circuit 50, the controller 100 may receive, as an input, data of a difference value between two continuous digital values of the base drive signal dA, and the base drive signal dA may be restored by adding each value of the data.

Figure 22:
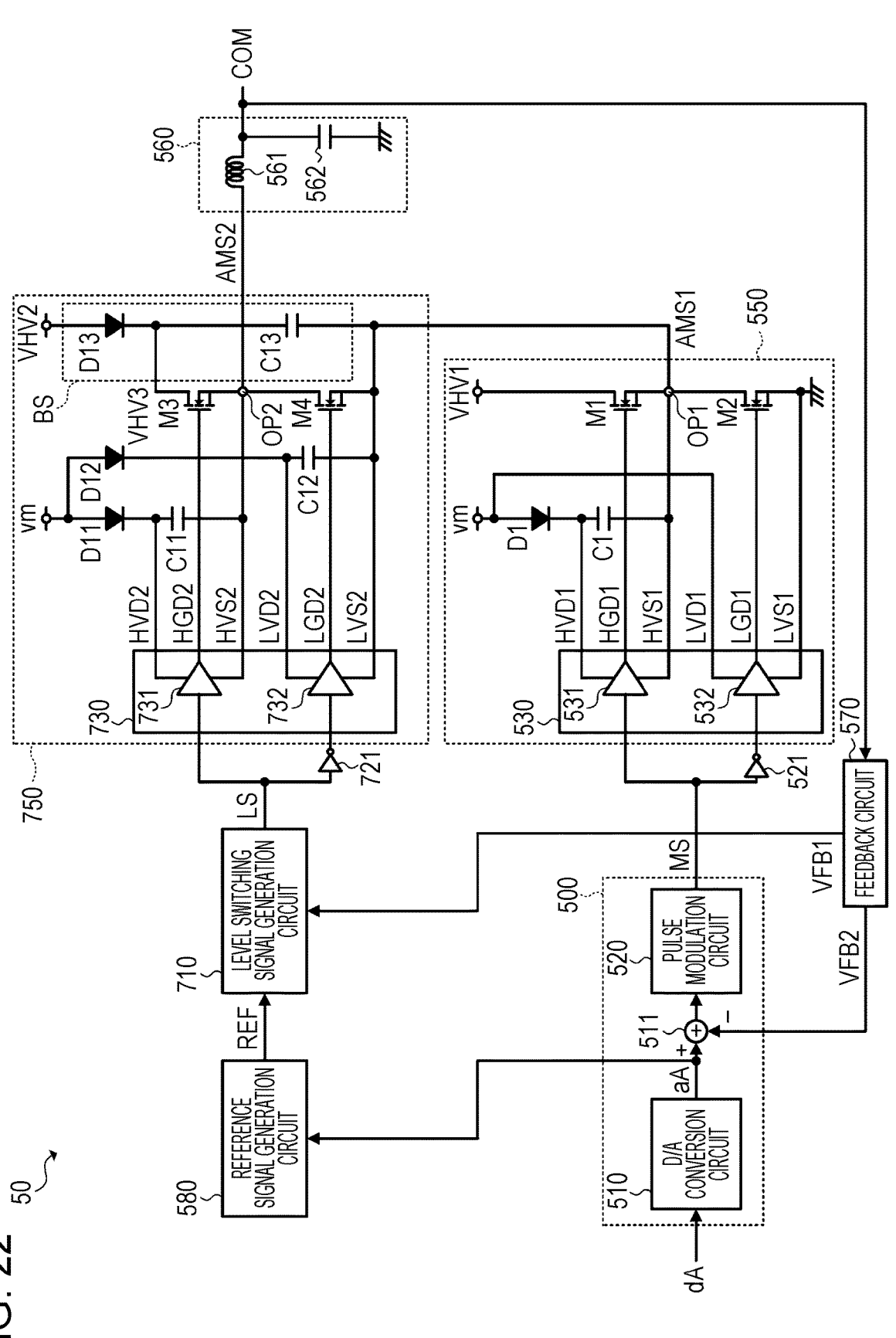
FIG. 22 is a diagram illustrating an example of a functional configuration of a drive circuit according to a modification example.

Moreover, for example, in the fourth embodiment to the sixth embodiment, although the reference signal generation circuit 580 generates the reference signal REF based on the base drive signal dA, the reference signal REF may be generated based on the base drive signal aA. FIG. 22 is a diagram illustrating an example of a functional configuration of a drive circuit 50 included in a liquid ejecting apparatus 1 of this modification example. As illustrated in FIG. 22, as in the fourth embodiment to the sixth embodiment, the drive circuit 50 according to the modification example includes a D/A conversion circuit 510, an adder 511, a pulse modulation circuit 520, an inverter 521, an amplification circuit 550, a demodulation circuit 560, a feedback circuit 570, a reference signal generation circuit 580, a level switching signal generation circuit 710, and a level shift circuit 750. Since configurations and functions of the D/A conversion circuit 510, the adder 511, the pulse modulation circuit 520, the inverter 521, the amplification circuit 550, the demodulation circuit 560, the feedback circuit 570, and the level shift circuit 750 are similar to any one of the fourth embodiment to the sixth embodiment, the description thereof will be omitted. The reference signal generation circuit 580 receives, as an input, a base drive signal aA of an analog signal obtained by converting a base drive signal dA by the D/A conversion circuit 510, and generates a reference signal REF based on the base drive signal aA. Since the base drive signal aA is the analog signal obtained by converting the base drive signal dA, the reference signal REF generated based on the base drive signal dA is a signal corresponding to the base drive signal dA. Specifically, the reference signal generation circuit 580 differentiates the base drive signal aA to generate the reference signal REF. Accordingly, the reference signal REF is a signal having a voltage corresponding to a temporal change amount in a voltage of the base drive signal aA, and the reference signal REF has a waveform close to a rectangular wave in a period in which the voltage of the base drive signal aA changes. Accordingly, the level shift circuit 750 performs an operation similar to the fourth embodiment to the sixth embodiment, and a drive signal COM having high waveform accuracy can be obtained regardless of a load capacitance.

Although the embodiments have been described above, the present disclosure is not limited to these embodiments, and can be implemented in various aspects without departing from the gist thereof. For example, the above-described embodiments can also be appropriately combined with each other.

The present disclosure includes substantially the same configurations as the configurations described in the embodiments, for example, configurations having the same functions, methods, and results, or configurations having the same objects and effects. Moreover, the present disclosure includes configurations in which non-essential parts of the configuration described in the embodiments are replaced. Moreover, the present disclosure includes configurations that achieve the same operational effects or configurations that can achieve the same objects as those of the configurations described in the embodiment. Moreover, the present disclosure includes configurations in which a known technology is added to the configurations described in the embodiments.

The following contents are derived from the above-described embodiments.

An aspect of a drive circuit is a drive circuit that outputs a drive signal for driving a drive section. The drive circuit includes a modulation circuit that modulates a base drive signal that is a base of the drive signal, and outputs a modulation signal, an amplification circuit that outputs a first amplified modulation signal obtained by amplifying the modulation signal, a reference signal generation circuit that generates a reference signal corresponding to the base drive signal, a level switching signal generation circuit that receives, as an input, the reference signal, and generates a level switching signal as a digital signal including a first potential and a second potential higher than the first potential, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, a demodulation circuit that demodulates the second amplified modulation signal, and outputs the drive signal, and a feedback circuit that outputs a first feedback signal in response to the drive signal. The level switching signal generation circuit switches a potential of the level switching signal in response to the reference signal and the first feedback signal.

In this drive circuit, the amplification circuit outputs the first amplified modulation signal obtained by amplifying the modulation signal, the reference signal generation circuit generates the reference signal corresponding to the base drive signal, the level switching signal generation circuit switches the potential of the level switching signal in response to the reference signal and the first feedback signal corresponding to the drive signal, and the level shift circuit outputs, as the second amplified modulation signal, the first amplified modulation signal or the signal obtained by shifting the potential of the first amplified modulation signal in accordance with the potential of the level switching signal. That is, since the level switching signal generation circuit generates the level switching signal such that the voltage of the first feedback signal that changes in accordance with the magnitude of the load capacitance follows the voltage of the reference signal, the level shift circuit can output an appropriate second amplified modulation signal corresponding to the magnitude of the load capacitance Accordingly, according to the drive circuit, the influence on the drive signal due to the change in the load capacitance is reduced, and the waveform accuracy of the drive signal can be improved.

In an aspect of the drive circuit, the reference signal generation circuit may include a storage that stores information on the base drive signal, and may generate the reference signal based on the information stored in the storage.

In an aspect of the drive circuit, the reference signal generation circuit may receive, as an input, the base drive signal, and may generate the reference signal based on the base drive signal.

In an aspect of the drive circuit, the feedback circuit may output a second feedback signal in response to the drive signal, and the modulation circuit may output the modulation signal based on the second feedback signal.

In the drive circuit, the amplification circuit can output an appropriate first amplified modulation signal by following the second feedback signal that changes in accordance with the magnitude of the load capacitance. Accordingly, according to the drive circuit, the influence on the drive signal due to the change in the load capacitance is reduced, and the waveform accuracy of the drive signal can be improved.

In an aspect of the drive circuit, the feedback circuit may include a high-pass filter.

In this drive circuit, since the feedback circuit outputs the first feedback signal of which the phase is advanced by the high-pass filter, the transitional responsiveness of the level switching signal generation circuit with respect to the change in the potential of the drive signal is improved, and the level shift circuit can output an appropriate second amplified modulation signal corresponding to the magnitude of the load capacitance. Accordingly, according to the drive circuit, since the overshoot or the undershoot in the waveform of the drive signal is reduced, the waveform accuracy of the drive signal can be improved.

In an aspect of the drive circuit, the level switching signal generation circuit may retain the potential of the level switching signal in a period in which a value of the base drive signal is constant.

According to the drive circuit, since the level shift circuit does not perform the switching operation in the period in which the potential of the drive signal is constant, the waveform accuracy of the drive signal COM can be improved.

In an aspect of the drive circuit, the level switching signal generation circuit may not retain the potential of the level switching signal in a first period in which a value of the base drive signal is constant, and may retain the potential of the level switching signal in a second period in which the value of the base drive signal is constant subsequently to the first period.

According to the drive circuit, the level switching signal generation circuit does not retain the potential of the level switching signal in the first period in which the value of the base drive signal dA is constant, and switches the potential of the level switching signal in response to the reference signal and the first feedback signal. As a result, the overshoot or the undershoot occurred in the drive signal can be reduced. Further, according to the drive circuit, the level switching signal generation circuit retains the potential of the level switching signal in the second period in which the value of the base drive signal is constant subsequently to the first period. Thus, since the level shift circuit does not perform the switching operation in the period in which the potential of the drive signal is constant, the waveform accuracy of the drive signal can be improved. An aspect of a liquid ejecting apparatus includes an ejecting section that ejects a liquid, and a drive circuit that outputs a drive signal for driving the ejecting section. The drive circuit includes a modulation circuit that modulates a base drive signal that is a base of the drive signal, and outputs a modulation signal, an amplification circuit that outputs a first amplified modulation signal obtained by amplifying the modulation signal, a reference signal generation circuit that generates a reference signal corresponding to the base drive signal, a level switching signal generation circuit that receives, as an input, the reference signal, and generates a level switching signal as a digital signal including a first potential and a second potential higher than the first potential, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, a demodulation circuit that demodulates the second amplified modulation signal, and outputs the drive signal, and a feedback circuit that outputs a first feedback signal in response to the drive signal, and the level switching signal generation circuit switches a potential of the level switching signal in response to the reference signal and the first feedback signal.

According to the liquid ejecting apparatus, in the drive circuit, the amplification circuit outputs the first amplified modulation signal obtained by amplifying the modulation signal, the reference signal generation circuit generates the reference signal corresponding to the base drive signal, the level switching signal generation circuit switches the potential of the level switching signal in accordance with the reference signal and the first feedback signal corresponding to the drive signal, and the level shift circuit outputs, as the second amplified modulation signal, the first amplified modulation signal or the signal obtained by shifting the potential of the first amplified modulation signal in accordance with the potential of the level switching signal. That is, since the level switching signal generation circuit generates the level switching signal such that the voltage of the first feedback signal that changes in accordance with the magnitude of the load capacitance follows the voltage of the reference signal, the level shift circuit can output an appropriate second amplified modulation signal corresponding to the magnitude of the load capacitance Accordingly, according to the liquid ejecting apparatus, since the influence on the drive signal due to the change in the load capacitance is reduced, the waveform accuracy of the drive signal can be improved, and the ejection accuracy of the liquid can be improved.

In an aspect of the liquid ejecting apparatus, the reference signal generation circuit may include a storage that stores information on the base drive signal, and may generate the reference signal based on the information stored in the storage.

In an aspect of the liquid ejecting apparatus, the reference signal generation circuit may receive, as an input, the base drive signal, and may generate the reference signal based on the base drive signal.

In an aspect of the liquid ejecting apparatus, the feedback circuit may output a second feedback signal in response to the drive signal, and the modulation circuit may output the modulation signal based on the second feedback signal.

In an aspect of the liquid ejecting apparatus, the feedback circuit may include a high-pass filter.

In an aspect of the liquid ejecting apparatus, the level switching signal generation circuit may retain the potential of the level switching signal in a period in which a value of the base drive signal is constant.

In an aspect of the liquid ejecting apparatus, the level switching signal generation circuit may not retain the potential of the level switching signal in a first period in which a value of the base drive signal is constant, and may retain the potential of the level switching signal in a second period in which the value of the base drive signal is constant subsequently to the first period.

What is claimed is:

1. A drive circuit that outputs a drive signal for driving a drive section, the drive circuit comprising:

a modulation circuit that modulates a base drive signal that is a base of the drive signal, and outputs a modulation signal;

an amplification circuit that outputs a first amplified modulation signal obtained by amplifying the modulation signal;

a reference signal generation circuit that generates a reference signal corresponding to the base drive signal;

a level switching signal generation circuit that receives, as an input, the reference signal, and generates a level switching signal as a digital signal including a first potential and a second potential higher than the first potential;

a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential;

a demodulation circuit that demodulates the second amplified modulation signal, and outputs the drive signal; and a feedback circuit that outputs a first feedback signal in response to the drive signal, wherein the level switching signal generation circuit switches a potential of the level switching signal in response to the reference signal and the first feedback signal.

2. The drive circuit according to claim 1, wherein the reference signal generation circuit includes a storage that stores information on the base drive signal, and generates the reference signal based on the information stored in the storage.

3. The drive circuit according to claim 1, wherein the reference signal generation circuit receives, as an input, the base drive signal, and generates the reference signal based on the base drive signal.

4. The drive circuit according to claim 1, wherein the feedback circuit outputs a second feedback signal in response to the drive signal, and the modulation circuit outputs the modulation signal based on the second feedback signal.

5. The drive circuit according to claim 1, wherein the feedback circuit includes a high-pass filter.

6. The drive circuit according to claim 1, wherein the level switching signal generation circuit retains the potential of the level switching signal in a period in which a value of the base drive signal is constant.

7. The drive circuit according to claim 1, wherein the level switching signal generation circuit does not retain the potential of the level switching signal in a first period in which a value of the base drive signal is constant, and retains the potential of the level switching signal in a second period in which the value of the base drive signal is constant subsequently to the first period.

8. A liquid ejecting apparatus comprising:
an ejecting section that ejects a liquid; and a drive circuit that outputs a drive signal for driving the ejecting section, wherein the drive circuit includes a modulation circuit that modulates a base drive signal that is a base of the drive signal, and outputs a modulation signal, an amplification circuit that outputs a first amplified modulation signal obtained by amplifying the modulation signal, a reference signal generation circuit that generates a reference signal corresponding to the base drive signal, a level switching signal generation circuit that receives, as an input, the reference signal, and generates a level switching signal as a digital signal including a first potential and a second potential higher than the first potential, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, a demodulation circuit that demodulates the second amplified modulation signal, and outputs the drive signal, and a feedback circuit that outputs a first feedback signal in response to the drive signal, and the level switching signal generation circuit switches a potential of the level switching signal in response to the reference signal and the first feedback signal.

9. The liquid ejecting apparatus according to claim 8, wherein the reference signal generation circuit includes a storage that stores information on the base drive signal, and generates the reference signal based on the information stored in the storage.

10. The liquid ejecting apparatus according to claim 8, wherein the reference signal generation circuit receives, as an input, the base drive signal, and generates the reference signal based on the base drive signal.

11. The liquid ejecting apparatus according to claim 8, wherein the feedback circuit outputs a second feedback signal in response to the drive signal, and the modulation circuit outputs the modulation signal based on the second feedback signal.

12. The liquid ejecting apparatus according to claim 8, wherein the feedback circuit includes a high-pass filter.

13. The liquid ejecting apparatus according to claim 8, wherein the level switching signal generation circuit retains the potential of the level switching signal in a period in which a value of the base drive signal is constant.

14. The liquid ejecting apparatus according to claim 8, wherein the level switching signal generation circuit does not retain the potential of the level switching signal in a first period in which a value of the base drive signal is constant, and retains the potential of the level switching signal in a second period in which the value of the base drive signal is constant subsequently to the first period.

* * * * *